(12) United States Patent
Lee et al.

(10) Patent No.: US 12,696,449 B2
(45) Date of Patent: Jul. 28, 2026

(54) SEMICONDUCTOR DEVICES AND DATA STORAGE SYSTEMS INCLUDING THE SAME

(71) Applicant: SAMSUNG ELECTRONICS CO., LTD., Suwon-si (KR)

(72) Inventors: Seulji Lee, Suwon-si (KR); Jinhyuk Kim, Suwon-si (KR); Byoungil Lee, Suwon-si (KR); Sehoon Lee, Suwon-si (KR); Jinwoo Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 552 days.

(21) Appl. No.: 18/202,111

(22) Filed: May 25, 2023

(65) Prior Publication Data

US 2023/0422502 A1     Dec. 28, 2023

(30) Foreign Application Priority Data

Jun. 24, 2022     (KR) ........................ 10-2022-0077324

(51) Int. Cl.
*H10B 43/27*          (2023.01)
*H10B 41/27*          (2023.01)
            (Continued)

(52) U.S. Cl.
CPC ............. *H10B 43/27* (2023.02); *H10B 41/27* (2023.02); *H10B 41/41* (2023.02); *H10B 43/40* (2023.02)

(58) Field of Classification Search
CPC ........ H10B 43/27; H10B 43/40; H10B 43/10; H10B 43/50; H10B 43/30; H10B 43/35;
            (Continued)

(56) References Cited

U.S. PATENT DOCUMENTS 8,581,321  B2     11/2013   Son et al.
8,643,084  B2     2/2014    Shin et al.
                  (Continued)

FOREIGN PATENT DOCUMENTS

KR     10-2016-0038642  A     4/2016
KR     10-2020-0141257  A     12/2020
KR     10-2022-0051041  A     4/2022

OTHER PUBLICATIONS

Communication dated Jan. 19, 2025, issued by the Korean Ministry of Intellectual Property in Korean Application No. 10-2022-0077324.

*Primary Examiner* — Sitaramarao S Yechuri
(74) *Attorney, Agent, or Firm* — Sughrue Mion, PLLC

(57)          ABSTRACT

A semiconductor device includes: a memory cell structure on a peripheral circuit structure; a through wiring region on the peripheral circuit structure; and a barrier structure surrounding the through wiring region. The memory cell structure includes: gate electrodes and first interlayer insulating layers that are alternately stacked, the gate electrodes forming a step shape on the second region; a channel structure; and isolation regions penetrating through the gate electrodes. The through wiring region includes: second interlayer insulating layers and sacrificial insulating layers alternately stacked on the second region; and a through contact plug penetrating through the second interlayer insulating layers and the sacrificial insulating layers, and electrically connected to the circuit devices. Each of the sacrificial insulating layers includes a recess portion that is horizontally recessed from the barrier structure toward each of the sacrificial insulating layers.

20 Claims, 28 Drawing Sheets

(51) Int. Cl.
    *H10B 41/41*        (2023.01)
    *H10B 43/40*        (2023.01)

(58) Field of Classification Search
    CPC ........ H10B 41/27; H10B 41/41; H10B 41/30;
                  H10B 41/35; H10B 41/40; H10B 41/50;
                              G06F 3/0658; G11C 5/06
    See application file for complete search history.

(56) References Cited

U.S. PATENT DOCUMENTS

| | | | |
|---|---|---|---|
| 9,576,966 B1 | 2/2017 | Peri et al. | |
| 9,673,216 B1 | 6/2017 | Baraskar et al. | |
| 10,381,376 B1 * | 8/2019 | Nishikawa | H10D 88/00 |
| 10,438,962 B2 | 10/2019 | Kim | |
| 11,164,750 B2 | 11/2021 | Takahashi et al. | |
| 2016/0092130 A1 | 3/2016 | Choi et al. | |
| 2020/0266128 A1 * | 8/2020 | Chen | H01L 23/485 |
| 2021/0066344 A1 | 3/2021 | Son et al. | |
| 2021/0151462 A1 * | 5/2021 | Baek | H10B 41/50 |
| 2022/0254733 A1 * | 8/2022 | Mizuno | H10B 41/27 |
| 2022/0254803 A1 * | 8/2022 | Shen | H10B 43/10 |

* cited by examiner

SEMICONDUCTOR DEVICES AND DATA STORAGE SYSTEMS INCLUDING THE SAME

CROSS-REFERENCE TO RELATED APPLICATION

This application claims priority to Korean Patent Application No. 10-2022-0077324, filed on Jun. 24, 2022, in the Korean Intellectual Property Office, the disclosure of which is incorporated by reference herein in its entirety.

BACKGROUND

Example embodiments relate to a semiconductor device and a data storage system including the same.

A semiconductor device with a large data storage capacity in a data storage system requiring data storage has been necessary. Accordingly, a method for increasing data storage capacity of a semiconductor device has been studied. For example, as one of methods for increasing data storage capacity of a semiconductor device, a semiconductor device including memory cells arranged three-dimensionally, instead of memory cells arranged two-dimensionally, has been suggested.

SUMMARY

One or more example embodiments provide a semiconductor device having improved productivity and improved reliability, and a data storage system including the semiconductor device.

According to an example embodiment, a semiconductor device, includes: a peripheral circuit structure including a first substrate and circuit devices on the first substrate; a memory cell structure on the peripheral circuit structure; a through wiring region on the peripheral circuit structure; and a barrier structure surrounding a side surface of the through wiring region. The memory cell structure includes: a second substrate having a first region and a second region; gate electrodes and first interlayer insulating layers that are alternately stacked so the gate electrodes are spaced apart from each other in a vertical direction perpendicular to an upper surface of the second substrate on the first region of the second substrate, the gate electrodes extending from the first region to the second region, and forming a step shape on the second region; a channel structure penetrating through the gate electrodes on the first region and including a channel layer; and isolation regions penetrating through the gate electrodes. The through wiring region includes: second interlayer insulating layers and sacrificial insulating layers alternately stacked on the second region; and a through contact plug penetrating through the second interlayer insulating layers and the sacrificial insulating layers, and electrically connected to the circuit devices. Each of the sacrificial insulating layers includes a recess portion that is horizontally recessed from the barrier structure toward each of the sacrificial insulating layers.

According to an example embodiment, a semiconductor device includes: a peripheral circuit structure including a first substrate; and a memory cell structure on the peripheral circuit structure. The memory cell structure includes: a second substrate having a first region and a second region; a first horizontal conductive layer on the first region of the second substrate; a horizontal insulating layer on the second region of the second substrate and spaced apart from the first horizontal conductive layer; a second horizontal conductive layer covering the first horizontal conductive layer and the horizontal insulating layer; gate electrodes and first interlayer insulating layers that are alternately stacked so the gate electrodes are spaced apart from each other in a vertical direction perpendicular to an upper surface of the second substrate on the second horizontal conductive layer, the gate electrodes forming a step shape on the second region; a channel structure extending in the vertical direction on the first region, penetrating through the gate electrodes and the first interlayer insulating layers, and including a channel layer; isolation regions penetrating through the gate electrodes and the first interlayer insulating layers, extending in a first horizontal direction, and spaced apart from each other in a second horizontal direction perpendicular to the first horizontal direction; and an upper support structure on the gate electrodes and having through-regions on the isolation regions. Each of the first interlayer insulating layers includes a first portion having a first thickness and a second portion having a thickness that decreases with increasing distance from the first portion toward the isolation regions. A boundary surface between the first portion and the second portion is vertically offset from side surfaces of the gate electrodes.

According to an example embodiment, a data storage system includes: a semiconductor storage device including a peripheral circuit structure which includes a first substrate and circuit devices on the first substrate, a through wiring region on the peripheral circuit structure, a barrier structure surrounding a side surface of the through wiring region, and an input/output pad electrically connected to the circuit devices; and a controller electrically connected to the semiconductor storage device through the input/output pad and configured to control the semiconductor storage device. The semiconductor storage device includes: a second substrate having a first region and a second region; gate electrodes and first interlayer insulating layers that are alternately stacked so the gate electrodes are spaced apart from each other in a vertical direction perpendicular to an upper surface of the second substrate on the first region of the second substrate, the gate electrodes extending from the first region to the second region, and forming a step shape on the second region; a channel structure penetrating through the gate electrodes on the first region and including a channel layer; and isolation regions penetrating through the gate electrodes. The through wiring region includes: second interlayer insulating layers and sacrificial insulating layers alternately stacked on the second region; and a through contact plug penetrating through the second interlayer insulating layers and the sacrificial insulating layers, and electrically connected to the circuit devices. The barrier structure includes a plurality of protrusions extending into the sacrificial insulating layers.

BRIEF DESCRIPTION OF DRAWINGS

The above and other aspects and features will be more apparent from the following description of example embodiments, taken in combination with the accompanying drawings, in which.

DETAILED DESCRIPTION

Hereinafter, example embodiments will be described as follows with reference to the accompanying drawings. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1A:
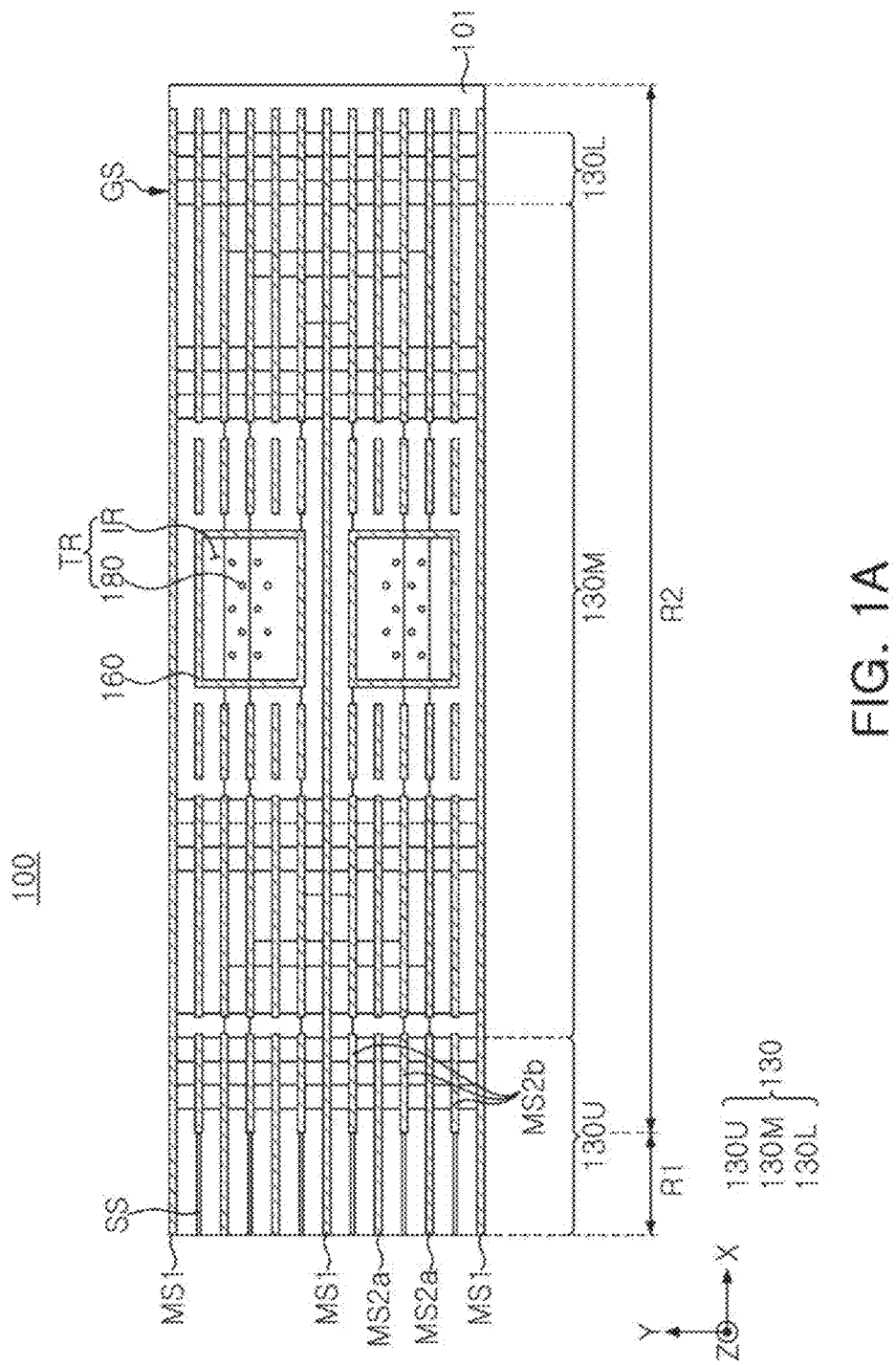
FIGS. 1A and 1B are plan diagrams illustrating a semiconductor device according to an example embodiment.
Figure 1B:
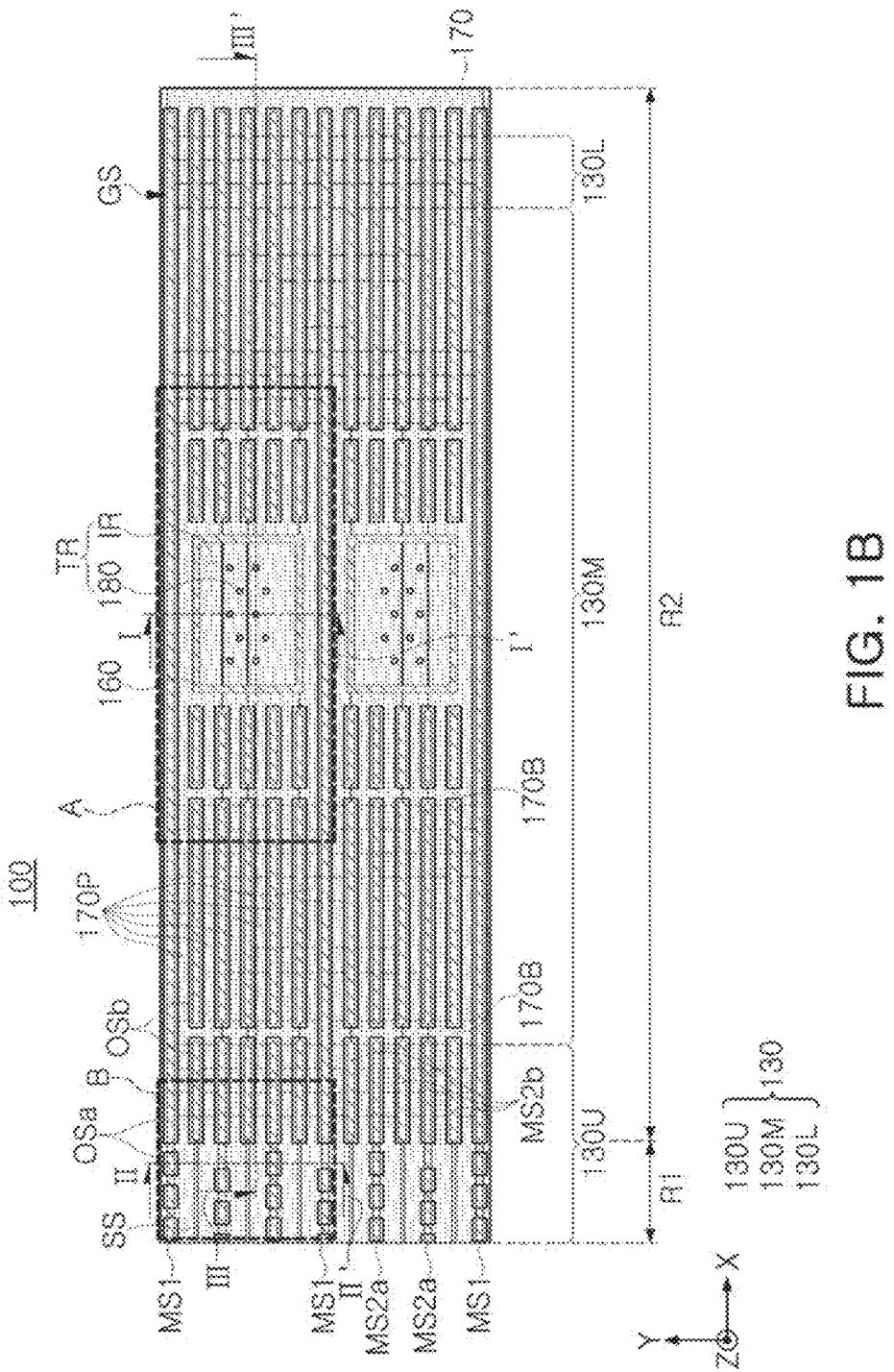

FIGS. 1A and 1B are plan diagrams illustrating a semiconductor device according to an example embodiment. FIG. 1B further illustrates an upper support structure with respect to the semiconductor device in FIG. 1A.

Figure 2A:
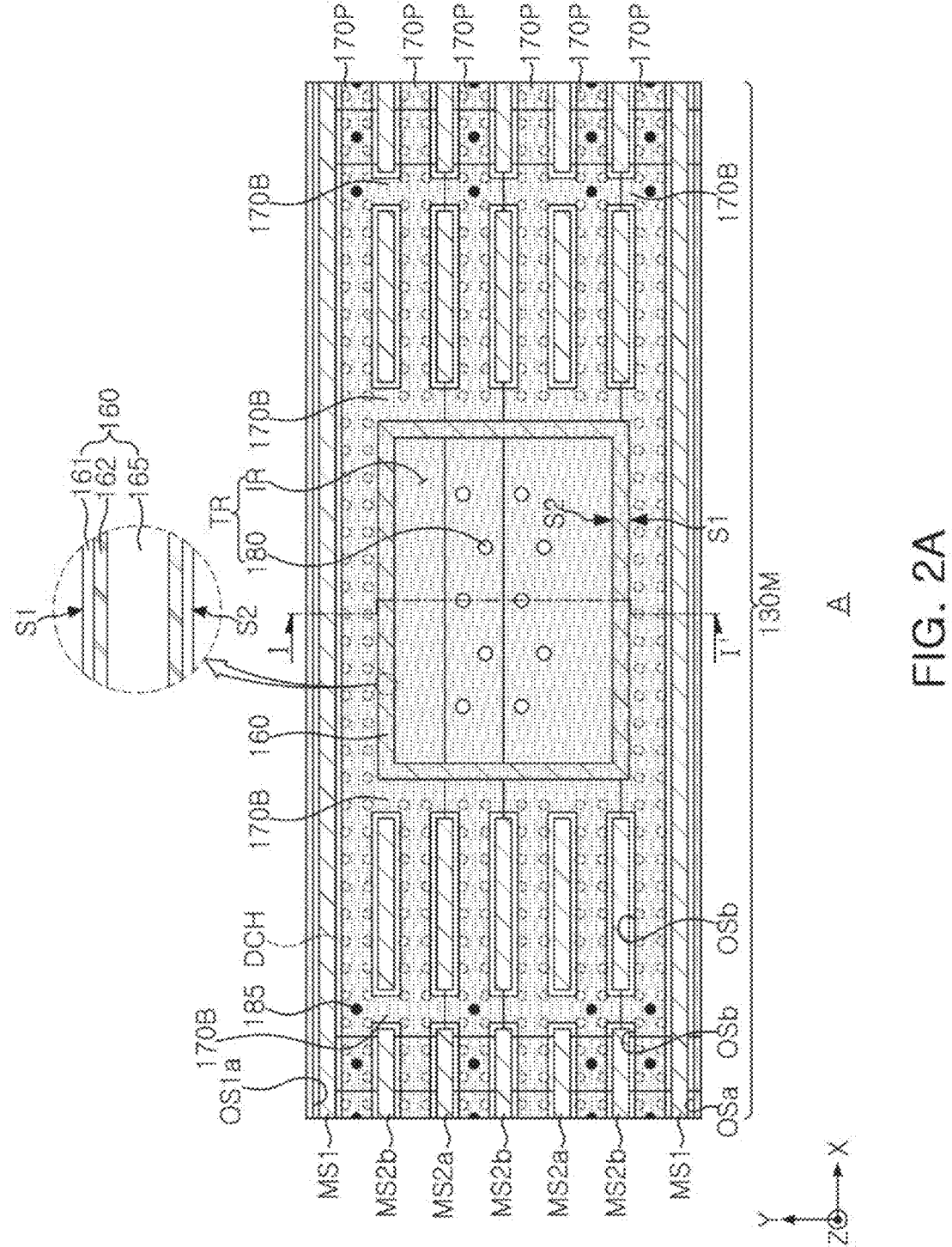
FIGS. 2A and 2B are cross-sectional diagrams illustrating a semiconductor device according to an example embodiment.
Figure 2B:
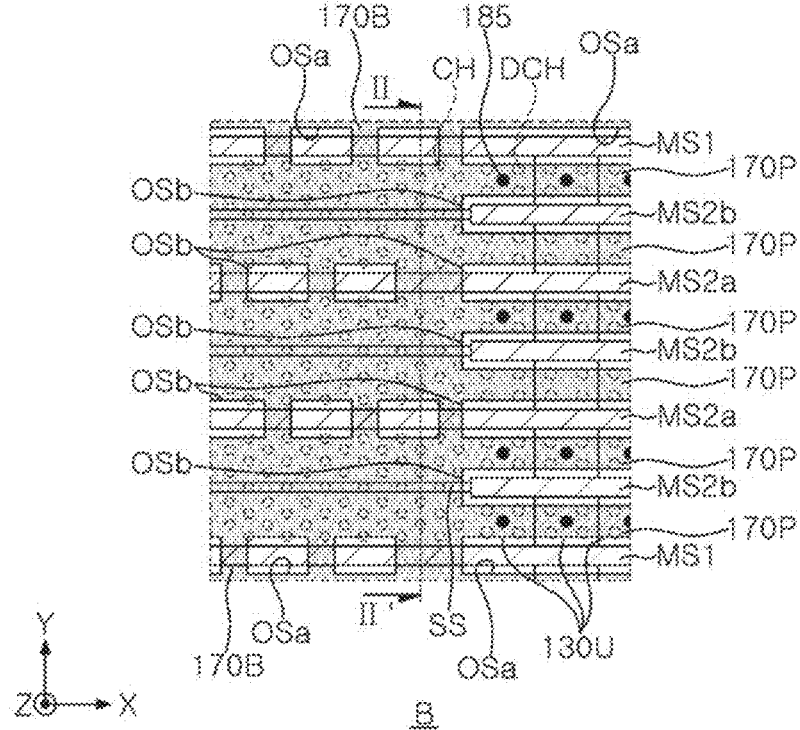

FIGS. 2A and 2B are cross-sectional diagrams illustrating a semiconductor device according to an example embodiment. FIG. 2A is an enlarged diagram illustrating region "A" in FIG. 1B, and FIG. 2B is an enlarged diagram illustrating region "B" in FIG. 1B.

Figure 3A:
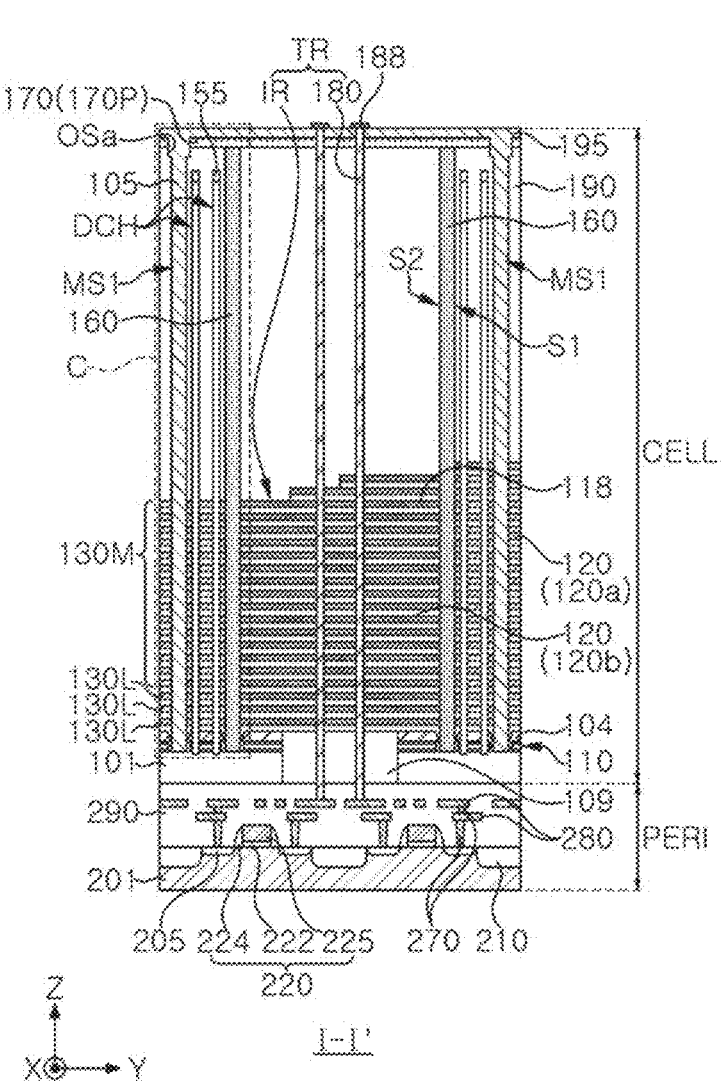
FIGS. 3A, 3B and 3C are cross-sectional diagrams illustrating a semiconductor device according to an example embodiment.
Figure 3B:
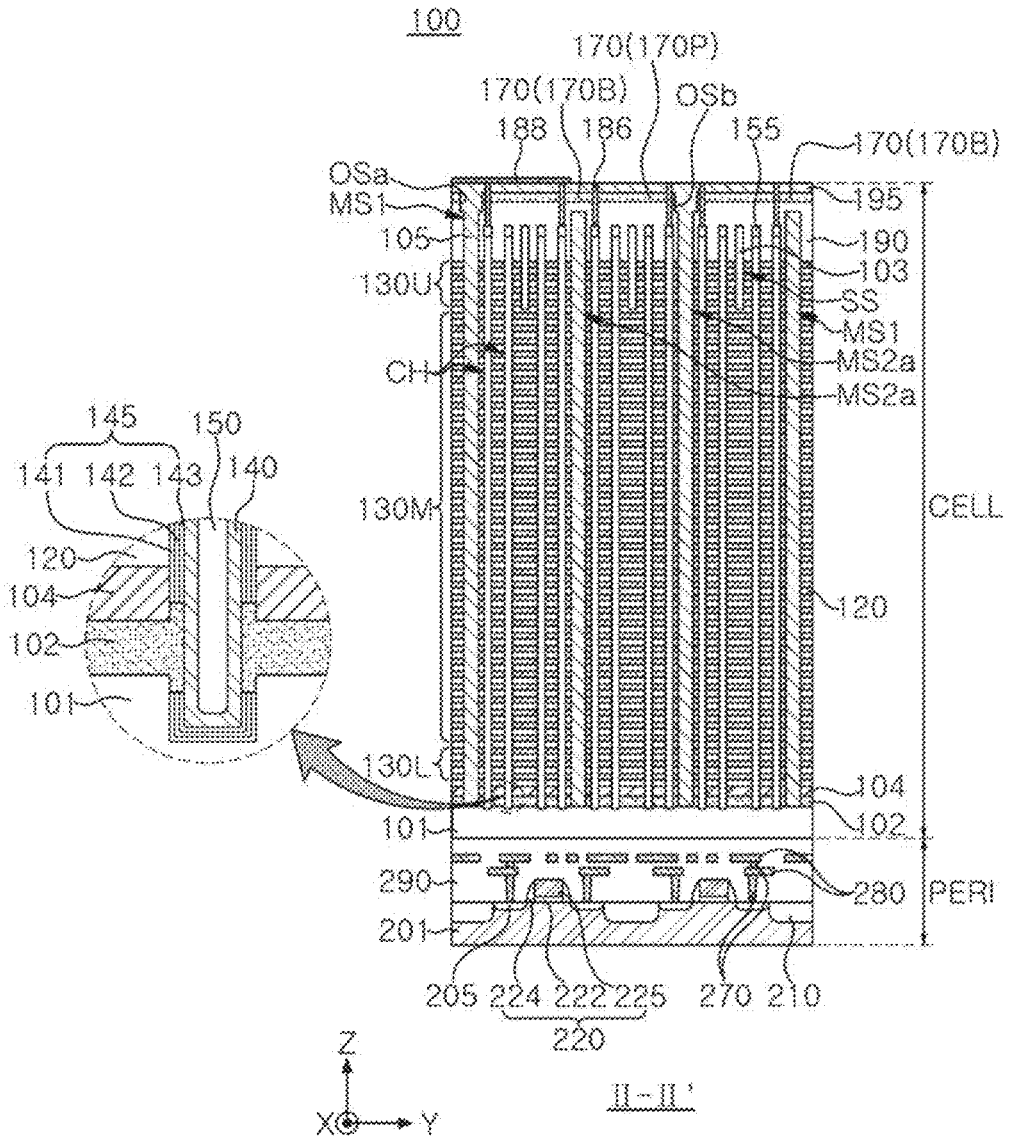
Figure 3C:
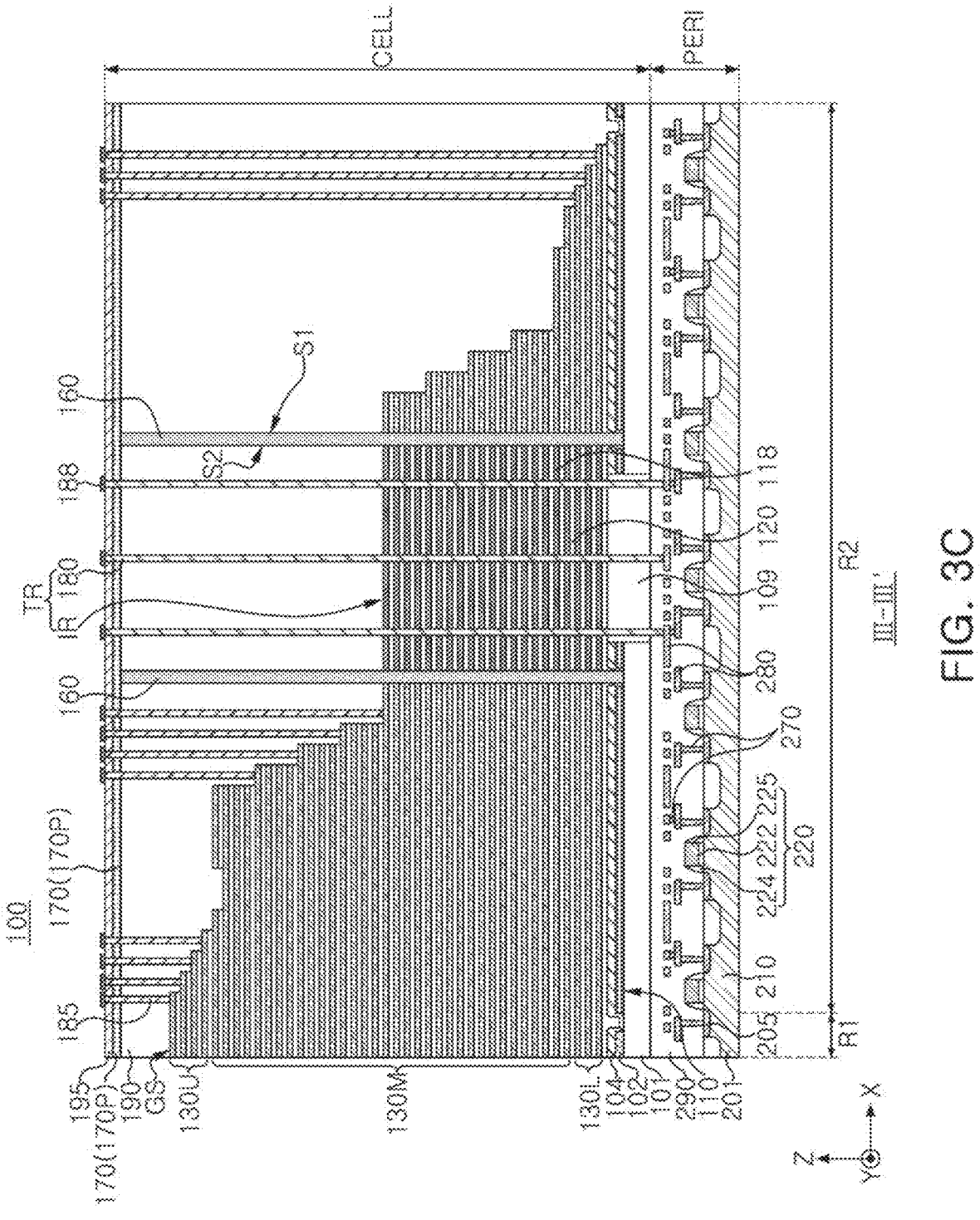

FIGS. 3A, 3B and 3C are cross-sectional diagrams illustrating a semiconductor device according to an example embodiment. FIG. 3A is a cross-sectional diagram taken along line I-I' in FIG. 1B, FIG. 3B is a cross-sectional diagram taken along line II-II' in FIG. 1B, and FIG. 3C is a cross-sectional diagram taken along line III-III' in FIG. 1B.

Figure 4:
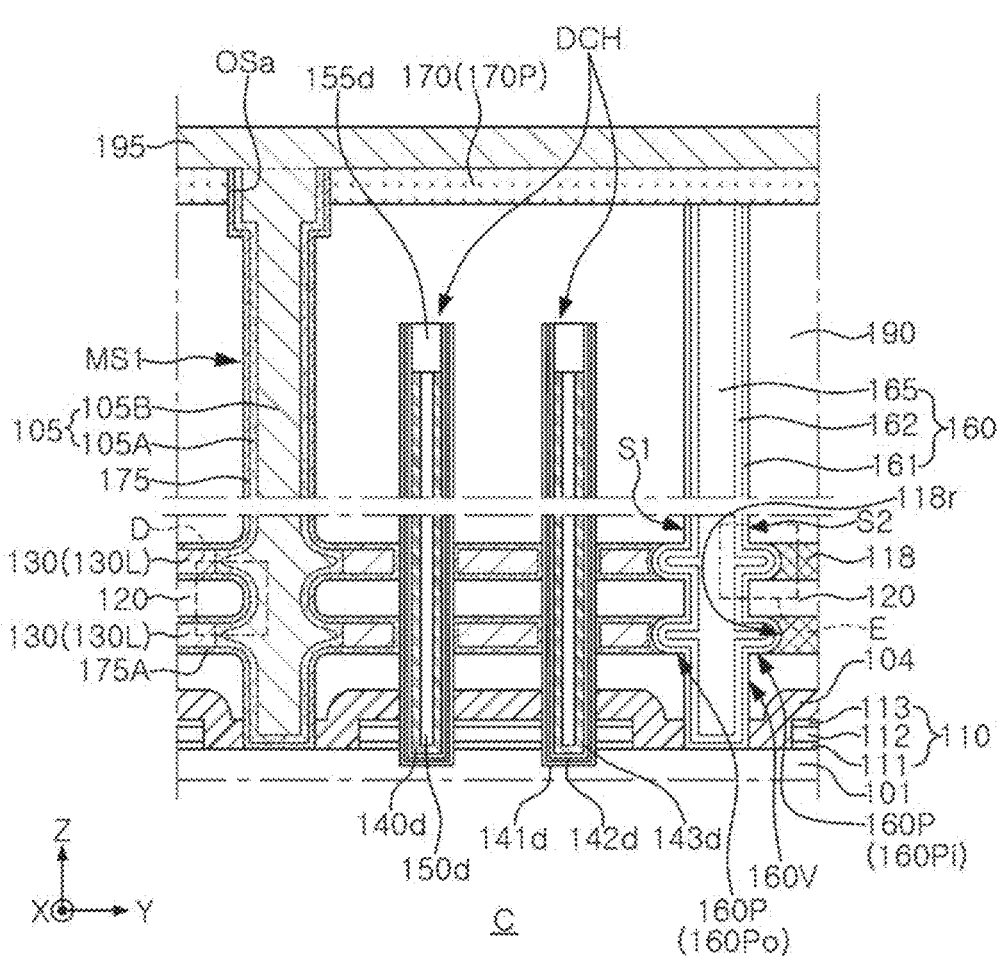
FIG. 4 is an enlarged diagram illustrating a portion of a semiconductor device according to an example embodiment.

FIG. 4 is an enlarged diagram illustrating a portion of a semiconductor device according to an example embodiment, illustrating region "C" in FIG. 3A.

Referring to FIGS. 1A to 4, the semiconductor device 100 may include a peripheral circuit structure PERI including a first substrate 201 and a memory cell structure CELL including a second substrate 101, and a through wiring region TR including through contact plugs 180 electrically connecting the peripheral circuit structure PERI to the memory cell structure CELL. The memory cell structure CELL may be disposed on the peripheral circuit PERI, and the through wiring region TR may penetrate through the memory cell structure CELL and may connect the memory cell structure CELL to the peripheral circuit structure PERI. Alternately, in example embodiments, the memory cell structure CELL may be disposed below the peripheral circuit structure PERI. Also, in example embodiments, the memory cell structure CELL and the peripheral circuit structure PERI may be bonded to each other by, for example, copper (Cu)-to-copper bonding.

The peripheral circuit structure PERI may include a first substrate 201, source/drain regions 205 and device isolation layers 210 in the first substrate 201, circuit devices 220 disposed on the first substrate 201, circuit contact plugs 270, circuit wiring lines 280, and a peripheral region insulating layer 290.

The first substrate 201 may have an upper surface extending in the x-direction and the y-direction. An active region may be defined in the first substrate 201 by the device isolation layers 210. Source/drain regions 205 including impurities may be disposed in a portion of the active region. The first substrate 201 may include a semiconductor material, such as, for example, a group IV semiconductor, a group III-V compound semiconductor, or a group II-VI compound semiconductor. The first substrate 201 may be provided as a bulk wafer or as an epitaxial layer.

The circuit devices 220 may include a planar transistor. Each of the circuit devices 220 may include a circuit gate dielectric layer 222, a spacer layer 224, and a circuit gate electrode 225. The source/drain regions 205 may be disposed in the first substrate 201 on both sides of the circuit gate electrode 225.

The peripheral region insulating layer 290 may be disposed on the circuit devices 220 on the first substrate 201. The circuit contact plugs 270 may penetrate through the peripheral region insulating layer 290 and may be connected to the source/drain regions 205. Electrical signals may be applied to the circuit devices 220 by the circuit contact plugs 270. In a region, the circuit contact plugs 270 may also be connected to the circuit gate electrode 225. The circuit wiring lines 280 may be connected to the circuit contact plugs 270 and may be arranged in a plurality of layers.

The memory cell structure CELL may include a second substrate 101 having a first region R1 and a second region R2, a first horizontal first on the first region R1 of the second substrate 101, a horizontal insulating layer 110 disposed in parallel with the first horizontal conductive layer 102 on the second region R2 of the second substrate 101, a second horizontal conductive layer 104 on the first horizontal conductive layer 102 and the horizontal insulating layer 110, a stack structure GS including gate electrodes 130 and interlayer insulating layers 120 alternately stacked on each other on the second horizontal conductive layer 104, a capping insulating layer 190 covering the stack structure GS, an upper support structure 170 on the capping insulating layer 190, first and second isolation regions MS1, MS2a, and MS2b extending by penetrating through the stack structure GS, and channel structures CH disposed to penetrate through the stack structure GS and including the channel layer 140.

The first region R1 of the second substrate 101 may be a region in which the gate electrodes 130 may be vertically stacked and the channel structures CH may be disposed, and memory cells may be disposed. The second region R2 may be a region in which the gate electrodes 130 may extend to have different lengths, and may be a region for connecting the memory cells to the peripheral circuit structure PERI. The second region R2 may be disposed on at least one end of the first region R1 in at least one direction, for example, the x-direction.

The second substrate 101 may have an upper surface extending in the x-direction and the y-direction. The second substrate 101 may include a semiconductor material, such as, for example, a group VI semiconductor, a group III-V compound semiconductor, or a group II-VI compound semiconductor. For example, a group IV semiconductor may include silicon, germanium, or silicon-germanium. The second substrate 101 may further include impurities. The second substrate 101 may be provided as an epitaxial layer or a polycrystalline semiconductor layer such as a polycrystalline silicon layer.

The first and second horizontal conductive layers 102 and 104 may be sequentially stacked on the upper surface of the first region R1 of the second substrate 101. The first horizontal conductive layer 102 may not extend to the second region R2 of the second substrate 101, and the second horizontal conductive layer 104 may extend to the second region R2.

The first horizontal conductive layer 102 may function as a portion of a common source line of the semiconductor device 100, for example, as a common source line together with the second substrate 101. As illustrated in the enlarged diagram in FIG. 3B, the first horizontal conductive layer 102 may be directly connected to the channel layer 140 around the channel layer 140.

The second horizontal conductive layer 104 may be in contact with the second substrate 101 in a portion of regions in which the first horizontal conductive layer 102 and the horizontal insulating layer 110 are not disposed. The second horizontal conductive layer 104 may cover an end of the first horizontal conductive layer 102 or the horizontal insulating layer 110 in the above regions, and may be bent to extend to the second substrate 101. Thus, the second horizontal conductive layer 104 may be in contact with the second substrate 101 while filling a space between the first horizontal conductive layer 102 and the horizontal insulating layer 110.

The first and second horizontal conductive layers 102 and 104 may include a semiconductor material, such as, for example, both the first and second horizontal conductive layers 102 and 104 may include polycrystalline silicon. In this case, at least the first horizontal conductive layer 102 may be a doped layer, and the second horizontal conductive layer 104 may be a doped layer or a layer including impurities diffused from the first horizontal conductive layer 102. However, in example embodiments, the second horizontal conductive layer 104 may be replaced with an insulating layer.

The horizontal insulating layer 110 may be disposed on the second substrate 101 in parallel with the first horizontal conductive layer 102 in at least a portion of the second region R2. As illustrated in FIG. 4, the horizontal insulating layer 110 may include first to third horizontal insulating layers 111, 112, and 113 sequentially stacked on the second region R2 of the second substrate 101. The horizontal insulating layer 110 may include layers remaining after a portion of the first horizontal conductive layer 102 is replaced with the first horizontal conductive layer 102 in the process of manufacturing the semiconductor device 100.

The horizontal insulating layer 110 may include silicon oxide, silicon nitride, silicon carbide, or silicon oxynitride. The first and third horizontal insulating layers 111 and 113 and the second horizontal insulating layer 112 may include different insulating materials. The first and third horizontal insulating layers 111 and 113 may include the same material. For example, the first and third horizontal insulating layers 111 and 113 may be formed of the same material as a material of the interlayer insulating layers 120, and the second horizontal insulating layer 112 may be formed of the same material as a material of the sacrificial insulating layers 118.

The gate electrodes 130 may be vertically stacked and spaced apart from each other on the second substrate 101 and may form a stack structure GS. The gate electrodes 130 may include a lower gate electrode 130L forming a gate of a ground select transistor, memory gate electrodes 130M forming a plurality of memory cells, and upper gate electrodes 130U forming gates of the string select transistors. The number of memory gate electrodes 130M forming memory cells may be variously changed according to capacity of the semiconductor device 100. According to an example embodiment, the number of the upper gate electrodes 130U and the number of the lower gate electrodes 130L may be 1 to 4 or more, and may have a structure the same as or different from the memory gate electrodes 130M. In example embodiments, the gate electrodes 130 may further include a gate electrode 130 disposed below the upper gate electrodes 130U and/or lower gate electrodes 130L of the upper gate electrodes 130U and included in an erase transistor used for an erase operation using a gate induced drain leakage (GIDL) phenomenon. Also, a portion of the gate electrodes 130, for example, the memory gate electrodes 130M adjacent to the upper or lower gate electrodes 130U and 130L, may be dummy gate electrodes.

The gate electrodes 130 may be vertically stacked and spaced apart from each other on the first region R1, and may extend from the first region R1 to the second region R2 by different lengths, and in this regard may form a step structure. As illustrated in FIG. 3C, the gate electrodes 130 may form a step structure between the gate electrodes 130 in the x-direction. In example embodiments, at least a portion of the gate electrodes 130, which is, a predetermined number of the gate electrodes 130, such as, for example, two to six gate electrodes 130, may form a gate group and a step structure may be formed between the gate groups in the x-direction. In this case, the gate electrodes 130 included in the gate group may be disposed to have a step structure in the y-direction as well. Due to the step structure, the gate electrodes 130 may form a step shape in which the lower gate electrode 130 may extend longer than the upper gate electrode 130, and may provide ends exposed upwardly from the interlayer insulating layers 120. In example embodiments, the gate electrodes 130 may have an increased thickness on the ends.

As illustrated in FIG. 1A, the gate electrodes 130 may be disposed to be isolated from each other in the y-direction by the first isolation regions MS1 extending in the x-direction. The gate electrodes 130 disposed between a pair of first isolation regions MS1 may form a memory block, but an example embodiment of the memory block is not limited thereto. A portion of the gate electrodes 130, for example, the memory gate electrodes 130M, may form a layer in a memory block.

The gate electrodes 130 may include a metal material, such as, for example, tungsten (W). In example embodiments, the gate electrodes 130 may include polycrystalline silicon or a metal silicide material. In example embodiments, the gate electrodes 130 may further include a diffusion barrier, and for example, the diffusion barrier may include tungsten nitride (WN), tantalum nitride (TaN), or titanium nitride (TiN), or a combination thereof.

Similarly to the gate electrodes 130, the interlayer insulating layers 120 may be spaced apart from each other in a direction perpendicular to an upper surface of the second substrate 101 and may be disposed to extend in the x-direction. The interlayer insulating layers 120 may include an insulating material such as silicon oxide or silicon nitride.

In an example embodiment, the interlayer insulating layers 120 may include first interlayer insulating layers 120a and second interlayer insulating layers 120b alternately stacked with the sacrificial insulating layers 118 on the second substrate 101. The first interlayer insulating layers 120a may be disposed between the gate electrodes 130. The second interlayer insulating layers 120b may be disposed between the sacrificial insulating layers 118 in the through wiring region TR. The first and second interlayer insulating layers 120a and 120b may be spaced apart from each other by the barrier structure 160 and may be disposed on the same level.

The first and second isolation regions MS1, MS2a, and MS2b may be disposed to penetrate through the gate electrodes 130 and to extend in the x-direction. The first and second isolation regions MS1, MS2a, and MS2b may be disposed to be parallel to each other. The first and second isolation regions MS1, MS2a, and MS2b may penetrate through the entirety of the gate electrodes 130 stacked on the second substrate 101 and may be connected to the second substrate 101. The first isolation regions MS1 may extend as a single region in the x-direction, and the second isolation regions MS2a and MS2b may intermittently extend between a pair of first isolation regions MS1 or may be disposed only in a portion of the regions. For example, the second central isolation regions MS2a may extend as a single region on the first region R1 and may intermittently extend in the x-direction on the second region R2. The second auxiliary isolation regions MS2b may be disposed only on the second region R2 and may intermittently extend in the x-direction. However, in example embodiments, the arrangement order of the first and second isolation regions MS1, MS2a, and MS2b and the number of the first and second isolation regions MS1, MS2a, and MS2b are not limited to the illustrated examples in FIG. 1A. The first and second isolation regions MS1, MS2a, and MS2b may not overlap the through wiring region TR and may be spaced apart from the through wiring region TR.

As illustrated in FIG. 3A to 3C, the isolation insulating layer 105 may be disposed in the first and second isolation regions MS1, MS2a, and MS2b. In example embodiments, the isolation insulating layer 105 may be connected to the upper insulating layer 195 in an upper portion. The isolation insulating layer 105 may have a shape in which a width may decrease toward the second substrate 101 due to a high aspect ratio, but an example embodiment thereof is not limited thereto, and the isolation insulating layer 105 may have a side surface perpendicular to the upper surface of the second substrate 101.

In example embodiments, a conductive layer may be further disposed in the isolation insulating layer 105 in the first and second isolation regions MS1, MS2a, and MS2b. In this case, the conductive layer may function as a common source line or a contact plug connected to the common source line of the semiconductor device 100.

In an example embodiment, the memory cell structure CELL may further include upper isolation regions SS. As illustrated in FIG. 1A, the upper isolation regions SS may extend in the x-direction between the first isolation regions MS1 and the second central isolation region MS2a and between the second central isolation regions MS2a on the first region R1. The upper isolation regions SS may be disposed to penetrate a portion of the gate electrodes 130 including the uppermost upper gate electrode 130U among the gate electrodes 130. As illustrated in FIG. 3B, the upper isolation regions SS may isolate four gate electrodes 130 including the upper gate electrodes 130U from each other in the y-direction. However, the number of gate electrodes 130 isolated by the upper isolation regions SS may be varied in example embodiments. The upper gate electrodes 130U isolated by the upper isolation regions SS may form different string selection lines. The upper isolation regions SS may include an insulating material. The insulating material may include, for example, silicon oxide, silicon nitride, or silicon oxynitride.

As illustrated in FIG. 2B, each of the channel structures CH may form a memory cell string, and may be spaced apart from each other while forming rows and columns on the first region R1. The channel structures CH may be disposed to form a grid pattern or may be disposed in a zigzag pattern in one direction. In this pattern, the channel structures CH are positioned diagonally and alternate between rows to create an alternating zigzag shape. The channel structures CH may have a columnar shape, and may have inclined side surfaces of which a width may decrease toward the second substrate 101 depending on an aspect ratio.

The channel structures CH may penetrate the gate electrodes 130, the second horizontal conductive layer 104, and the first horizontal conductive layer 102 and may be in contact with the second substrate 101. The channel structures CH may extend into the second substrate 101 and may be in contact with the second substrate 101, but an example embodiment thereof is not limited thereto.

As illustrated in the enlarged diagram in FIG. 3B, the channel layer 140 may be disposed in the channel structures CH. In the channel structures CH, the channel layer 140 may be formed in an annular shape surrounding the channel filling insulating layer 150 therein, but in example embodiments, the channel layer 140 may have a columnar shape such as a cylindrical shape or a prism shape. The channel filling insulating layer 150 may include an insulating material such as silicon oxide. The channel layer 140 may be connected to the first horizontal conductive layer 102 in a lower portion. The channel layer 140 may include a semiconductor material such as polycrystalline silicon or single crystal silicon.

In an example embodiment, each of the channel structures CH may further include a dielectric layer 145 and a conductive pad 155.

The dielectric layer 145 may be disposed between the gate electrodes 130 and the channel layer 140. The dielectric layer 145 may surround at least a portion of an external side surface of the channel layer 140. As illustrated in the enlarged diagram in FIG. 3B, the dielectric layer 145 may include a tunneling layer 143, a charge storage layer 142, and a blocking layer 141 sequentially stacked on the channel layer 140. The tunneling layer 143 may tunnel electric charges into the charge storage layer 142, and may include, for example, silicon oxide ($SiO_2$), silicon nitride ($Si_3N_4$), silicon oxynitride (SiON), or a combination thereof. The charge storage layer 142 may be a charge trap layer or a floating gate conductive layer. The blocking layer 141 may block electric charges trapped in the charge storage layer 142 from moving to the gate electrodes 130, and may include, for example, silicon oxide ($SiO_2$), silicon nitride ($Si_3N_4$), silicon oxynitride (SiON), or a high-κ dielectric material, or a combination thereof.

The conductive pad 155 may be disposed to be electrically connected to the channel layer 140. In an example embodiment, the conductive pad 155 may cover the upper surface of the channel filling insulating layer 150 on the upper surface of the channel filling insulating layer 150, and the channel layer 140 may surround the side surface of the conductive pad 155. Alternatively, the conductive pad 155 may be disposed on the channel layer 140. The conductive pad 155 may include, for example, doped polycrystalline silicon.

The memory cell structure CELL of the semiconductor device 100 according to example embodiments may further include support structures DCH. The support structures DCH may have a hole shape penetrating through the stack structure GS, and may be spaced apart from each other while forming rows and columns in a portion of the first region R1 and the second region R2. In an example embodiment, the support structures DCH may be oval-shaped holes disposed in a region adjacent to the gate contact plug 191, but the arrangement and the shape of the support structures DCH are not limited thereto. The support structures DCH may not be electrically connected to upper wiring structures or may not form a memory cell string differently from the channel structures CH in the semiconductor device 100. The support structures DCH may be configured to support the channel structure CH to the gate contact plug 191. The support structures DCH may penetrate through the stack structure GS, the second horizontal conductive layer 104, and the horizontal insulating layer 110 in the z-direction and may be in contact with the second substrate 101.

In an example embodiment, each of the supporting structures DCH may have a structure the same as or similar to the channel structure CH. In this case, each of the supporting structures DCH may include first to third dielectric layers 141*d*, 142*d*, and 143*d* corresponding to the blocking layer 141, the charge storage layer 142, and the tunneling layer 143 of the gate dielectric layer 145 of the channel structure CH as illustrated in FIG. 4. The first to third dielectric layers 141*d*, 142*d*, and 143*d* may be sequentially stacked on an internal side wall of each hole of the support structures DCH. Each of the supporting structures DCH may further include a dummy channel layer 140*d*, a dummy filling insulating layer 150*d*, and a dummy conductive pad 155*d* corresponding to the channel layer 140, the channel filling insulating layer 150, and the conductive pad 155 of the channel structure CH, respectively. Each of the first to third dielectric layers 141*d*, 142*d*, and 143*d* may include silicon oxide, silicon nitride, silicon oxynitride, or a combination thereof, and the dummy channel layer 140*d* may include a semiconductor such as polycrystalline silicon or single crystal silicon. The dummy channel filling insulating layer 150*d* may include silicon oxide.

In the channel structures CH, the gate dielectric layer 145 may be partially penetrated by the first horizontal conductive layer 102 and may be divided into an upper gate dielectric layer and a lower gate dielectric layer, but the first to third dielectric layers 141*d*, 142*d*, and 143*d* of the support structures DCH may have a continuous structure.

The through wiring region TR may be a region including a wiring structure for electrically connecting the memory cell structure CELL to the peripheral circuit structure PERI. Also, the through wiring region TR may be disposed to penetrate through the second region R2. The through wiring region TR may include through contact plugs 180 penetrating the second substrate 101 and extending in the z-direction, and an insulating region IR surrounding the through contact plugs 180. In example embodiments, a region within the barrier structures 160 may be referred to as a through wiring region TR. For example, a single through wiring region TR may be disposed per one memory block, and the through wiring region TR may be further disposed on the first region R1. However, the number, size, arrangement, and shape of the through wiring regions TR may be varied in example embodiments. For example, in example embodiments, a single through-line region TR may be disposed in each of the plurality of memory blocks.

As illustrated in FIGS. 1A and 1B, the through wiring region TR may be disposed to be spaced apart from the first and second isolation regions MS1, MS2*a*, and MS2*b*. For example, the through wiring region TR may be spaced apart from the first isolation regions MS1 adjacent to each other in the y-direction and may be disposed between a pair of first isolation regions MS1. By this arrangement, the sacrificial insulating layers 118 may remain in the through wiring region TR.

The insulating region IR may penetrate through the memory cell structure CELL and may be disposed to be surrounded by the second substrate 101 and the gate electrodes 130. In the insulating region IR, the gate electrode 130 may not extend or may be disposed, and the insulating region IR may include an insulating stack structure formed of an insulating material. The insulating region IR may include a substrate insulating layer 109, which is a first insulating layer disposed on the same level as a level of the second substrate 101 and in parallel with the second substrate 101, interlayer insulating layers 120 and sacrificial insulating layers 118, which are second and third insulating layers alternately stacked on the upper surface of the second substrate 101.

The substrate insulating layer 109, which is the first insulating layer, may be disposed in a region from which a portion of the second substrate 101, the horizontal insulating layer 110, and the second horizontal conductive layer 104 are removed, and may be disposed to be surrounded by the second substrate 101, the horizontal insulating layer 110, and the second horizontal conductive layer 104. The lower surface of the substrate insulating layer 109 may be substantially coplanar with the lower surface of the second substrate 101 or may be disposed on a level lower than a level of the lower surface of the second substrate 101. In example embodiments, the substrate insulating layer 109 may include a plurality of insulating layers. Because the second insulating layer is formed by extending the interlayer insulating layers 120, the second insulating layer may be disposed on substantially the same level as a level of the interlayer insulating layers 120. The third insulating layer may include sacrificial insulating layers 118 and may be disposed on substantially the same level as a level of the gate electrodes 130, but an example embodiment thereof is not limited thereto.

The substrate insulating layer 109, the interlayer insulating layers 120, and the sacrificial insulating layers 118 included in the insulating region IR may be formed of an insulating material. For example, each of the substrate insulating layer 109, the interlayer insulating layers 120, and the sacrificial insulating layers 118 may include silicon oxide, silicon nitride, or silicon oxynitride. The substrate insulating layer 109 and the sacrificial insulating layers 118 may have different widths or may have the same width in example embodiments.

The through contact plugs 180 may vertically penetrate the entirety of the insulating region IR and may extend perpendicular to the upper surface of the second substrate 101, and may electrically connect the circuit devices 220 of the memory cell structure CELL and the peripheral circuit structure PERI to each other. For example, the through contact plugs 180 may electrically connect the gate electrodes 130 and/or the channel structures CH of the memory cell structure CELL to the circuit devices 220 of the peripheral circuit structure PERI. The through contact plugs 180 may be connected to the wiring lines 188 in an upper portion. The through contact plugs 180 may be connected to the circuit wiring lines 280 which are the lower wiring structures in a lower portion.

The through contact plugs 180 may penetrate through the interlayer insulating layers 120 and the sacrificial insulating layers 118 of the insulating region IR, and may penetrate through the substrate insulating layer 109 in a lower portion. The number, shape, and shape of the through contact plugs 180 in the through wiring region TR may be varied in example embodiments. In example embodiments, the through contact plugs 180 may have a form in which a plurality of layers are connected to each other. Also, in example embodiments, in addition to the through contact plugs 180, wiring structures in the form of wiring lines may be further disposed in the insulating region IR. The through contact plugs 180 may include a conductive material, and may include, for example, tungsten (W), copper (Cu), aluminum (Al), or the like.

The barrier structure 160 may be disposed to surround the through wiring region TR in the second region R2. On a plane, the barrier structure 160 may include horizontal regions extending in parallel to the first and second isolation regions MS1, MS2a, and MS2b extending in the x-direction and vertical regions extending in the y-direction. In an example embodiment, the horizontal regions and the vertical regions may form a single closed curve, and the barrier structure 160 may be disposed in a slit having a rectangular shape, a ring shape or a shape similar thereto on a plane. The barrier structure 160 may prevent a material forming the gate electrodes 130 from flowing into the through wiring region TR during a process of manufacturing the semiconductor device.

As illustrated in FIGS. 2A, 3C, and 4, the barrier structure 160 may be disposed in a boundary between the gate electrodes 130 and the sacrificial insulating layers 118. An external side surface S1 of the barrier structure 160 may oppose the gate electrodes 130, and an internal side surface S2 of the barrier structure 160 may oppose the sacrificial insulating layers 118. In an example embodiment, the internal side surface S2 of the barrier structure 160 may be in contact with the sacrificial insulating layers 118. In example embodiments, the terms "external side surface" and "internal side surface" used in relation to the barrier structure 160 may refer to the side surface oriented to the external region of the barrier structure 160 and the side surface oriented to the internal region surrounded by the barrier structure 160.

The barrier structure 160 may be disposed on substantially the same level as a level of the first and second isolation regions MS1, MS2a, and MS2b. This may be because the barrier structure 160 may be formed in a trench formed in the same process of forming the first and second isolation regions MS1, MS2a, and MS2b. Also, similarly to the arrangement of the first and second isolation regions MS1, MS2a, and MS2b on the second region R2, in the barrier structure 160, the second horizontal conductive layer 104 may be disposed in a region in direct contact with the second substrate 101. Accordingly, the barrier structure 160 may penetrate through the second horizontal conductive layer 104 on the lower end and may be in contact with the second horizontal conductive layer 104, and may be spaced apart from the first horizontal conductive layer 102 and the horizontal insulating layer 110. An upper surface of the barrier structure 160 may be disposed on a level higher than a level of an upper surface of each of the supporting structures DCH.

As illustrated in FIG. 4, the barrier structure 160 may include a first barrier insulating layer 161, a second barrier insulating layer 162, and a gap-fill layer 165 sequentially stacked on internal side surfaces and a bottom surface of the barrier structure 160. The gap-fill layer 165 may be disposed in a central region of the barrier structure 160, and the first and second barrier insulating layers 162 and 165 may cover side surfaces and a bottom surface of the gap-fill layer 165. The first barrier insulating layer 161 and the second barrier insulating layer 162 may include different materials, and the gap-fill layer 165 may include a material different from materials of the first and second barrier insulating layers 161 and 162. Each of the first and second barrier insulating layers 161 and 162 may include one of silicon oxide, silicon nitride, and silicon oxynitride. For example, the first barrier insulating layer 161 may include silicon oxide, and the second barrier insulating layer 162 may include silicon nitride. In an example embodiment, the gap-fill layer 165 may include a semiconductor material, such as, for example, polycrystalline silicon. However, in example embodiments, the gap-fill layer 165 may include an insulating material, such as, for example, silicon oxide.

The first barrier insulating layer 161 may extend in the z-direction while covering the bottom and side surfaces of the slit. The first barrier insulating layer 161 may cover external side surfaces and a bottom surface of the second barrier insulating layer 162. The first barrier insulating layer 161 may be adjacent to the gate electrodes 130 on the external side surface S1 of the barrier structure 160, and may be adjacent to the sacrificial insulating layers 118 on the internal side surface S2 of the barrier structure 160. A lower end of the first barrier insulating layer 161 may be in contact with an upper surface of the second substrate 101 or may be disposed to be partially recessed into the second substrate 101.

The second barrier insulating layer 162 may be disposed on the first barrier insulating layer 161, and may be disposed on internal side surfaces of the first barrier insulating layer 161 opposing each other, for example. The second barrier insulating layer 162 may be disposed between the first barrier insulating layer 161 and the gap-fill layer 165. The second barrier insulating layer 162 may cover side surfaces and a bottom surface of the gap-fill layer 165. In the second barrier insulating layer 162, the first barrier insulating layer 161 may cover the bottom surface of the slit, and the second barrier insulating layer 162 may extend in the z-direction along internal side surfaces of the first barrier insulating layer 161. The second barrier insulating layer 162 may be in direct contact with the internal side surfaces of the first barrier insulating layer 161. The internal side surfaces of the second barrier insulating layer 162 may be in direct contact with the gap-fill layer 165.

The lower surface and side surfaces of the gap-fill layer 165 may be surrounded by the second barrier insulating layer 162. The gap-fill layer 165 may be disposed to have a rectangular shape, a ring shape or a shape similar thereto on a plane. The gap-fill layer 165 may be disposed in a central region of the barrier structure 160 between internal side surfaces of the second barrier insulating layer 162 opposing each other. Here, the central region may extend with respect to, for example, a central axis between the external side surface S1 and the internal side surface S2 in the barrier structure 160.

The upper support structure 170 may be disposed on the stack structure GS of the gate electrodes 130 and may cover the capping insulating layer 190. The upper support structure 170 may be disposed on a level higher than levels of the channel structures CH, the support structures DCH, the first and second isolation regions MS1, MS2a, and MS2b, and the barrier structure 160.

As illustrated in FIGS. 1B to 2B, the support structure 170 may include support patterns 170P disposed in positions overlapping the gate electrodes 130, and through-regions OSa and OSb disposed in positions overlapping the first and second isolation regions MS1, MS2a, and MS2b. The through-regions OSa and OSb may penetrate the support patterns 170P in the z-direction. The first width w1 of the through-regions OSa and OSb may be greater than the second width w2 of the first and second isolation regions MS1, MS2a, and MS2b.

As illustrated in FIGS. 1B to 2B, the support structure 170 may further include bridge patterns 170B spaced apart from each other in the x-direction. The bridge patterns 170B may be disposed in a region in which the through-regions OSa and OSb are not disposed and may connect the support patterns 170P to each other. In the semiconductor device 100, because the support structure 170 may include the support patterns 170P and the bridge patterns 170B, the stack structure GS formed by the gate electrodes 130 may be prevented from being tilted.

The through-regions OSa and OSb disposed on the first region R1 may be intermittently spaced apart from each other in the x-direction. The through-regions OSa and OSb disposed in the first region R1 may be arranged in a zigzag pattern in the y-direction. In this pattern, the through-regions OSa and OSb are positioned diagonally and alternate between rows to create an alternating zigzag shape. A portion of the through-regions OSa and OSb, the through-region OSa, disposed on the first isolation regions MS1 of the second region R2, may continuously extend in the x-direction. The other portion of the through-regions OSa and OSb, the through-region OSb, disposed on the second isolation regions MS2a and MS2b of the second region R2 may be spaced apart from each other in the x-direction. The region in which the other portions OSb are spaced apart from each other in the x-direction may overlap, in the z-direction, the region of the second region R2 in which the second central isolation regions MS2a are spaced apart from each other in the x-direction and/or the region in which the second auxiliary isolation regions MS2b are spaced apart from each other in the x-direction.

Figure 13:
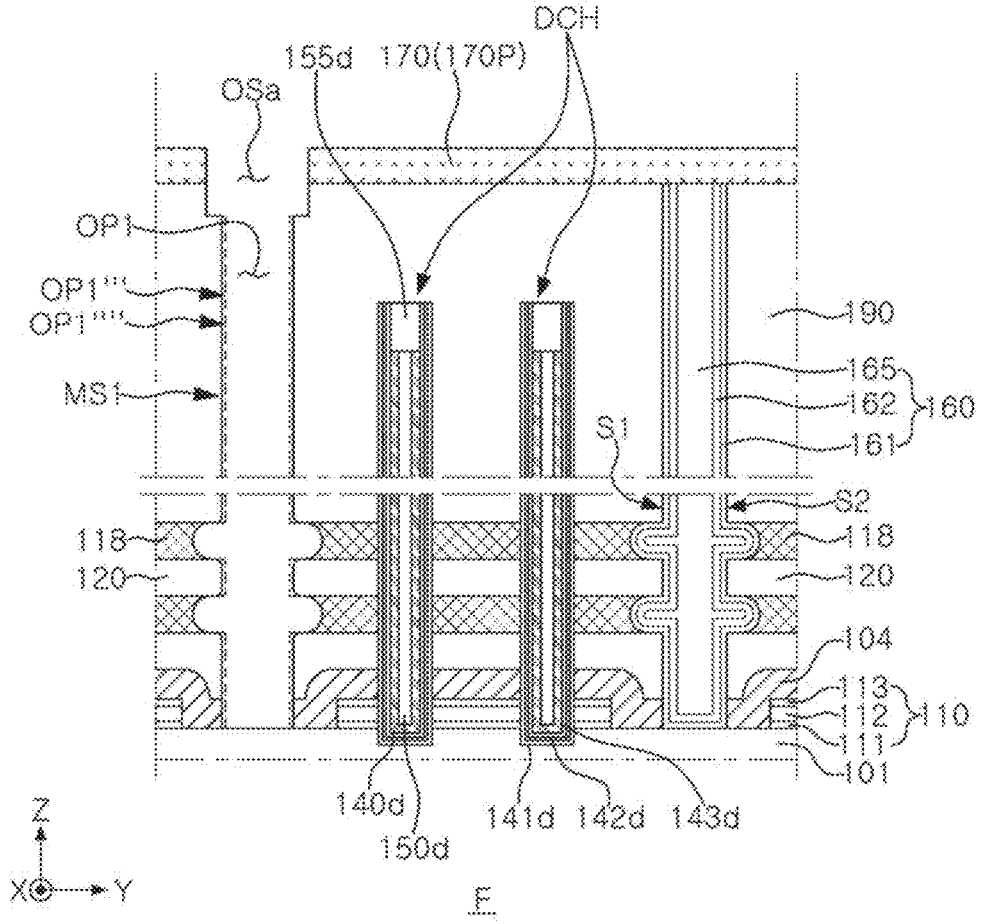

The through-regions OSa and OSb may provide an entrance path for an etchant for replacing the sacrificial insulating layers 118 with the gate electrodes 130 in FIG. 4 through the first openings OP1 (see FIG. 13). In example embodiments, the arrangement of the through-regions OSa and OSb may be varied, and accordingly, the arrangement of the bridge patterns 170B of the support structure 170 may be varied.

A metal oxide layer 175 may be disposed on side surfaces of the support pattern 170P exposed through the through-regions OSa and OSb. The metal oxide layer 175 may extend in the z-direction along side surfaces of the isolation regions MS1, MS2a, and MS2b and side surfaces of the through-regions OSa and OSb. The metal oxide layer 175 may cover sidewalls of the interlayer insulating layers 120 exposed by the isolation regions MS1a, MS2a, and MS2b, may extend horizontally to a region between the interlayer insulating layers 120 and may surround at least a portion of the conductive layer forming the gate electrodes 130. The metal oxide layer 175 may include, for example, a metal oxide such as aluminum oxide. In an example embodiment, the metal oxide layer 175 may block electric charges trapped in the charge storage layer 142 from moving to the gate electrodes 130 together with the blocking layer 141.

An isolation insulating layer 105 may be disposed in the isolation regions MS1, MS2a, and MS2b and the through-regions OSa and OSb. The isolation insulating layer 105 may include a plurality of insulating layers, and for example, the isolation insulating layer 105 may include a first insulating layer 105A and a second insulating layer 105B on the first insulating layer 105A. Side surfaces and lower surfaces of the second insulating layer 105B may be surrounded by the first insulating layer 105A. The first insulating layer 105A of the isolation insulating layer 105 may cover at least a portion of the metal oxide layer 175. The second insulating layer 105B of the isolation insulating layer 105 may be connected to the upper insulating layer 195. The first insulating layer 105A may include recess portions curved inwardly toward the gate electrodes 130. Each of the first insulating layer 105A and the second insulating layer 105B may include an insulating material such as silicon oxide, silicon nitride, or silicon carbide.

The through-regions OSa and OSb and the isolation regions MS1, MS2a, and MS2b may have distinct boundaries with the capping insulating layer 190 or the upper support structure 170 by the metal oxide layer 175 disposed on the sidewall disposed therein. Because the capping insulating layer 190 in contact with the through-regions OSa and OSb and the supporting patterns 170P of the upper support structure 170 may include an insulating material such as silicon oxide or silicon nitride, and the metal oxide layer 175 may include a material different the insulating material, the boundaries may be distinct. A boundary between the first and second insulating layers 105A and 105B of the isolation insulating layer 105 may be distinct or indistinct. For example, when both the first and second insulating layers 105A and 105B include silicon oxide, a boundary between the first and second insulating layers 105A and 105B may be distinct or indistinct depending on process conditions.

The capping insulating layer 190 may cover the stack structure GS on the second substrate 101. In an example embodiment, the capping insulating layer 190 may be formed of an insulating material, and may include a plurality of insulating layers. The capping insulating layer 190 may include the same material as a material of the interlayer insulating layers 120, and may include, for example, silicon oxide.

The upper insulating layer 195 may be disposed to cover the upper surface of the upper support structure 170. The upper insulating layer 195 may be formed of an insulating material, and may include a plurality of insulating layers. The upper insulating layer 195 may include, for example, silicon oxide.

As illustrated in FIG. 3C, the gate contact plug 185 may penetrate the upper insulating layer 195, the upper support structure 170, and the capping insulating layer 190 on the second region R2 and may be connected to the gate electrodes 130 of which upper surfaces are upwardly exposed among the gate electrodes 130.

The wiring lines 188 may be included in an upper wiring structure electrically connected to memory cells disposed in the memory cell structure CELL. The wiring lines 188 may be electrically connected to, for example, the through contact plugs 180, the gate electrodes 130, and the channel structures CH. The number of the contact plugs and the wiring lines included in the wiring structure may be varied in example embodiments. The wiring lines 192 may include a metal, such as, for example, tungsten (W), copper (Cu), aluminum (Al), or the like.

Figure 12:
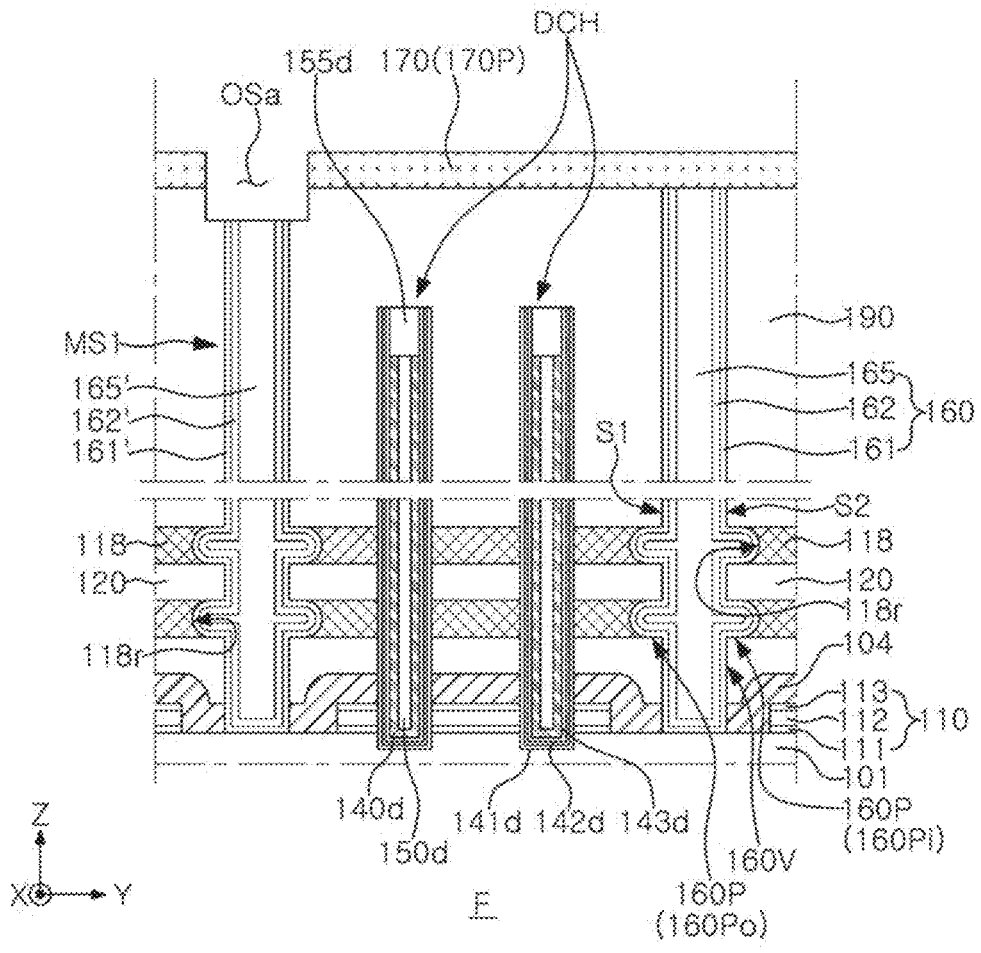
Figure 14:
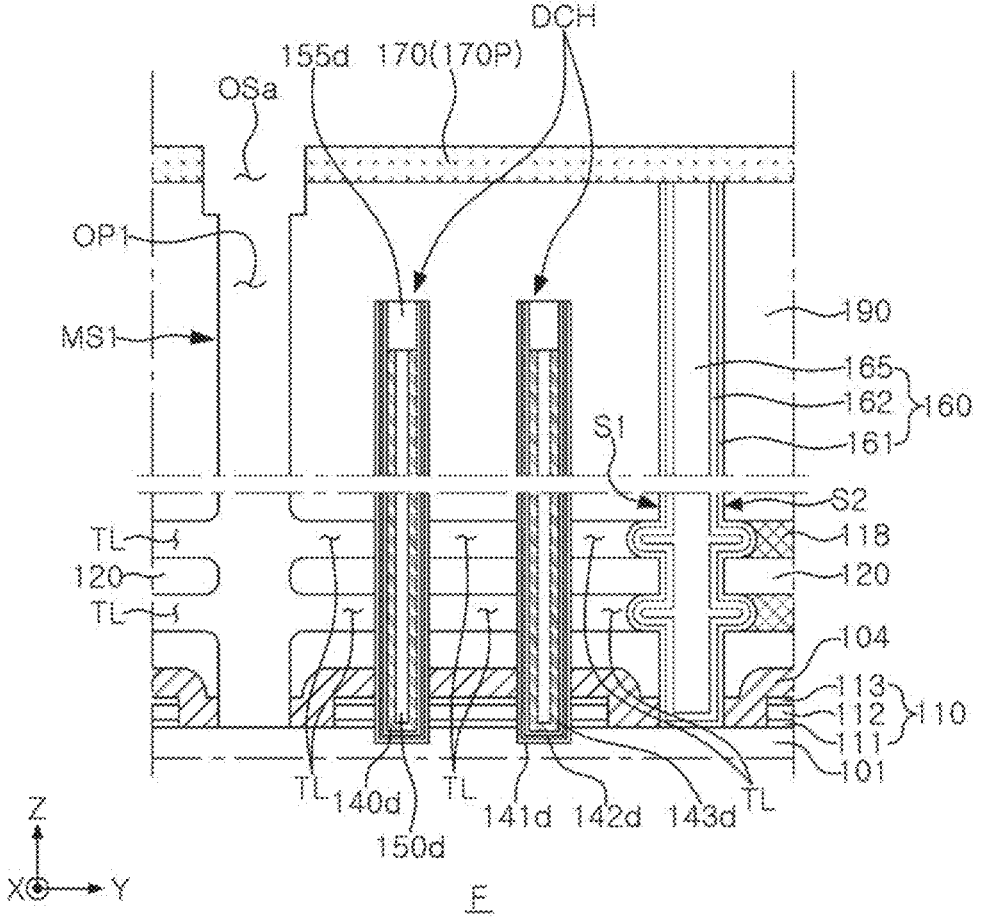

In an example embodiment, each of the interlayer insulating layers 120 may include a side portion of which a thickness may decrease toward the first and second isolation regions MS1, MS2a, and MS2b, as illustrated in FIG. 4. The side portion may have a rounded shape. Due to the shape of the side portion, a distance between the interlayer insulating layers 120 adjacent to each other may increase toward the first and second isolation regions MS1, MS2a, and MS2b. Referring to FIGS. 12 to 14, the gate electrodes 130 may be formed by filling the tunnel portions TL (see FIG. 13) with a conductive material through the first and second isolation regions MS1, MS2a and MS2b. Due to the shape of the side portion, a width of an entrance from the first and second isolation regions MS1, MS2a, and MS2b toward the tunnel portions TL may be relatively increased. Accordingly, in the process of forming the gate electrodes 130, process difficulty may be addressed and the quality of the gate electrodes 130 may improve as the conductive material may be relatively easily filled or may be filled with high density. Thus, the semiconductor device 100 having improved productivity and reliability may be provided through the shape of the side portion.

In an example embodiment, each of the sacrificial insulating layers 118, which is the third insulating layer of the insulating region IR, may have a recess portion 118r in a horizontal direction from the barrier structure 160 toward the sacrificial insulating layers 118. The recess portion 118r may have an inwardly curved shape in the horizontal direction, but an example embodiment thereof is not limited thereto. The depth of the recess portion 118r may be in the range of about 10 nm to about 60 nm. In example embodiments, the "depth" of the recess portion 118r may refer to the maximum depth of the recess portion, for example along the horizontal direction. In an example embodiment, the second barrier insulating layer 161 of the barrier structure 160 may be in contact with the recess portion 118r of each of the sacrificial insulating layers 118.

The barrier structure 160 may include a plurality of protrusions 160P extending in the horizontal direction from the vertical portion 160V extending in the z-direction. The plurality of protrusions 160P may be disposed on substantially the same level as a level of the gate electrodes 130 and/or the sacrificial insulating layers 118. Each of the plurality of protrusions 160P may have a rounded end, for example.

The plurality of protrusions 160P may include a plurality of inner protrusions 160Pi extending from the internal side surface S2 of the barrier structure 160 into the recess portion 118r of the sacrificial insulating layers 118 and a plurality of outer protrusions 160Po extending in a direction from the external side surface S1 of the barrier structure 160 toward the gate electrodes 130.

Each of the plurality of inner protrusions 160Pi and the plurality of outer protrusions 160Po may have substantially the same length. In an example embodiment, a length of the plurality of inner protrusions 160Pi may be the same as a depth of the recess portion 118r of the sacrificial insulating layers 118.

The plurality of protrusions 160P of the barrier structure 160 may have a structure formed to form the side portions of the interlayer insulating layers 120. In an example embodiment, a trench for forming the barrier structures 160 and the first and second isolation regions MS1, MS2a, and MS2b may be simultaneously formed. As the process of forming the first horizontal conductive layer 102 or the process of forming the upper support structure 170 may be performed through the first and second isolation regions MS1, MS2a, and MS2b, the interlayer insulating layers 120 may be partially removed in the above processes. In the semiconductor device 100 according to example embodiments, a process of further removing a portion of the sacrificial insulating layers 118 through the barrier structure 160 and the first and second isolations regions MS1, MS2a, and MS2b may be further included to address the difficulty in forming the rounded side portion as the interlayer insulating layers 120 are partially removed. Accordingly, the semiconductor device 100 including the recess portion 118r and the plurality of protrusions 160P may be provided.

Figure 5A:
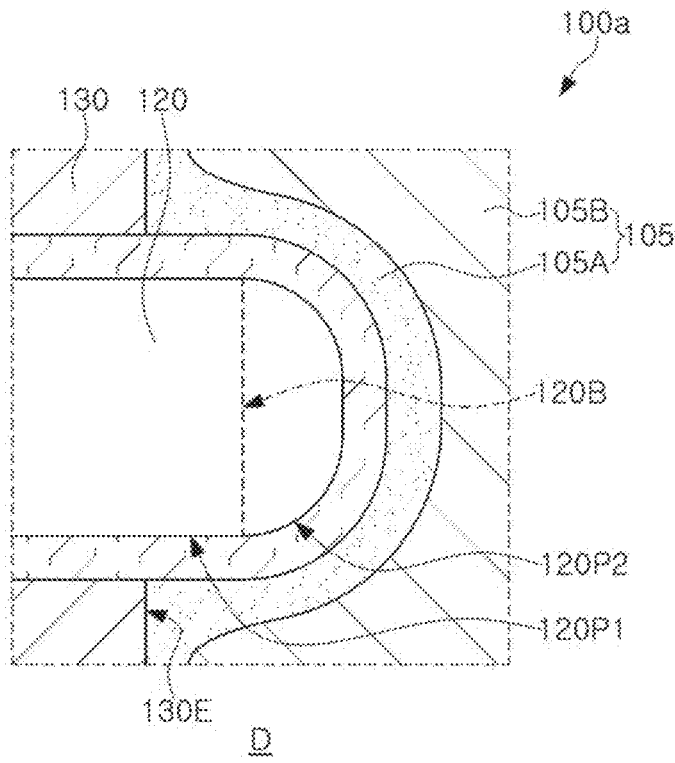
FIGS. 5A and 5B are enlarged diagrams illustrating a portion of a semiconductor device according to an example embodiment.
Figure 5B:
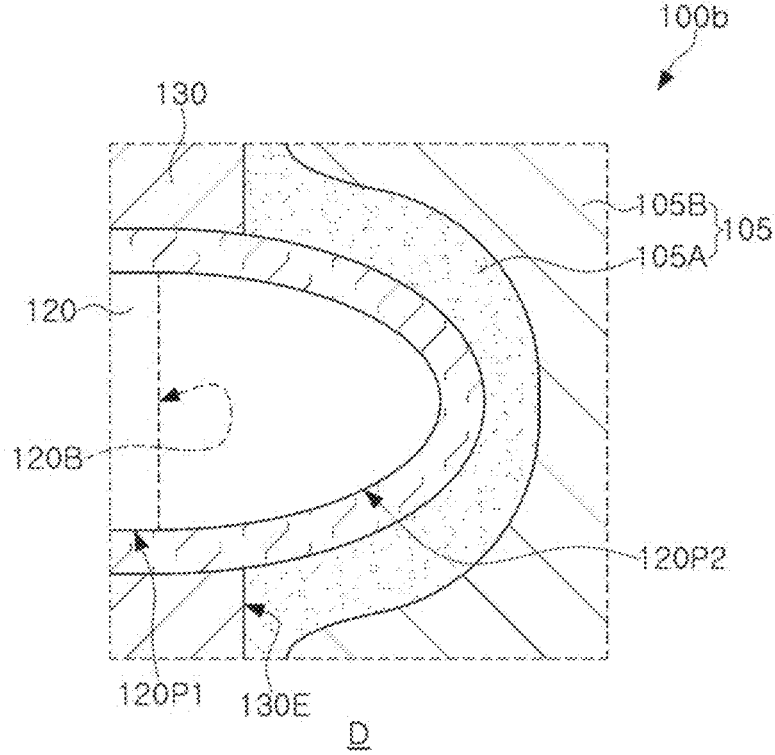

FIGS. 5A and 5B are enlarged diagrams illustrating a portion of a semiconductor device according to an example embodiment, illustrating region "D" in FIG. 4.

Referring to FIG. 5A, each of the interlayer insulating layers 120 of the semiconductor device 100a may include a first portion 120P1 and a second portion 120P2. The first portion 120P1 may be a portion having a substantially uniform thickness, and the second portion 120P2 may be a portion of which a thickness may decrease toward the first and second isolation regions MS1, MS2a, and MS2b. For example, the second portion 120P2 may correspond to the side portion described with reference to FIG. 4. A boundary surface between the first and second portions 120P1 and 120P2 may be referred to as a first boundary surface 120B.

In an example embodiment, the second portion 120P2 may have a rounded shape, such as, for example, an outwardly curved shape toward the first and second isolation regions MS1, MS2a, and MS2b.

Each of the gate electrodes 130 may include a side portion oriented in a direction toward the first and second isolation regions MS1, MS2a, and MS2b. A side surface of the side portion of each of the gate electrodes 130 may be referred to as a second boundary surface 130E.

The gate electrodes 130 may completely overlap the first portion P1 of the interlayer insulating layers 120 in the z-direction. The first boundary surface 120B may overlap the second boundary surface 130E in the z-direction, but differently from the example, the first boundary surface 120B may be disposed more adjacent to the central axis of the first and second isolation regions MS1, MS2a and MS2b and may not overlap the second boundary surface 130E, which may be because the process of forming of the second portion P2 and the forming of the gate electrodes 130 may be performed in independent processes.

Referring to FIG. 5B, in the semiconductor device 100b, at least a portion of the gate electrodes 130 may overlap the second portion 120P2 of the interlayer insulating layers 120 in the z-direction. The first boundary surface 120B may be disposed further away from the central axis of the first and second isolation regions MS1, MS2a, and MS2b than the second boundary surface 130E. This may be because the sacrificial insulating layers 118 may be relatively more removed in the process of removing the sacrificial insulating layers 118 in FIG. 10, or the conductive material may be formed relatively less in the tunnel portions TL in the process of forming the gate electrodes 130 in FIG. 14.

In an example embodiment, as the gate electrodes 130 may be filled along the shape of the second portion 120P2, the gate electrodes 130 may have a portion in which the thickness thereof may increase toward the second boundary surface 130E.

Figure 6A:
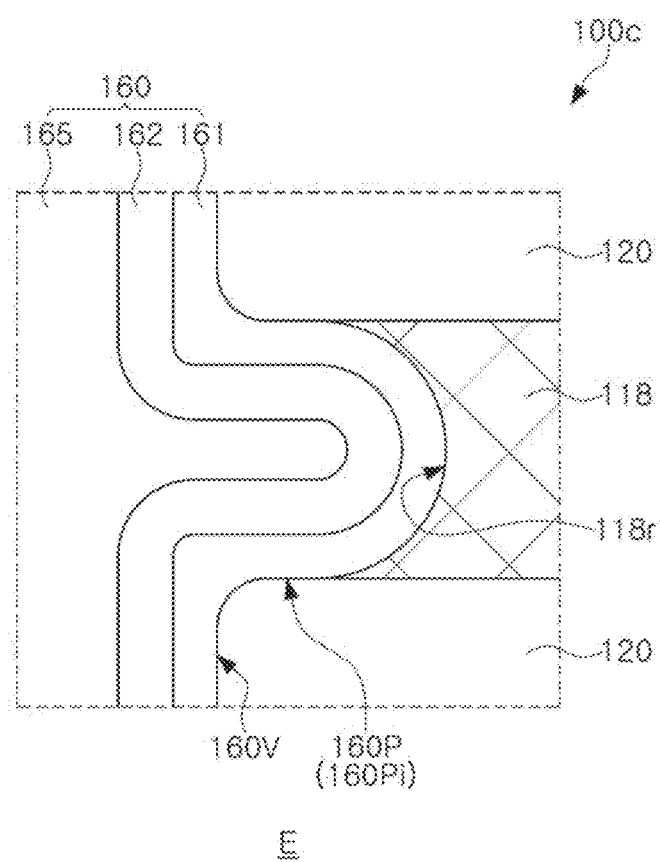
FIGS. 6A, 6B and 6C are enlarged diagrams illustrating a portion of a semiconductor device according to an example embodiment.
Figure 6B:
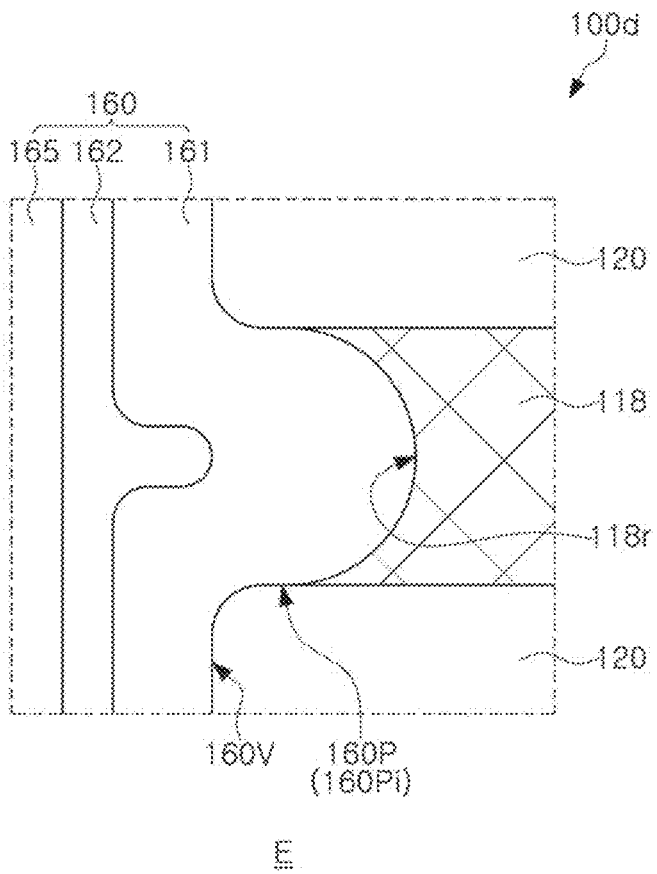
Figure 6C:
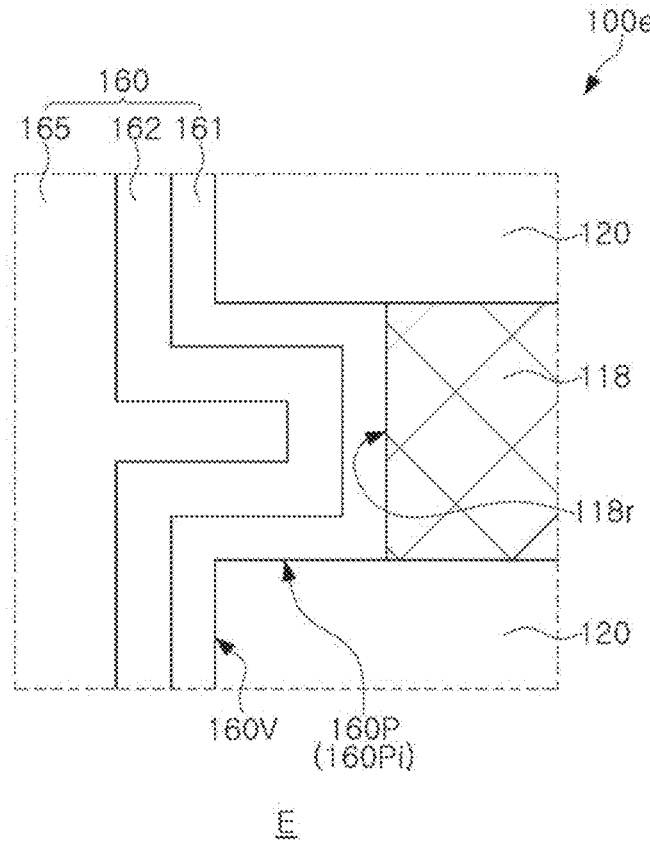

FIGS. 6A to 6C are enlarged diagrams illustrating a portion of a semiconductor device according to an example embodiment, illustrating region "E" in FIG. 4.

Referring to FIG. 6A, first and second bather insulating layers 161 and 162 may be sequentially stacked in the recess portion 118r of each of the sacrificial insulating layers 118. This may be because a portion of the sacrificial insulating layers 118 exposed from the trench for forming the barrier structure 160 may be removed, and thereafter, the first and second barrier insulating layers 161 and 162 may be sequentially stacked.

Referring to FIG. 6B, the first barrier insulating layer 161 may be disposed in the recess portion 118r of each of the sacrificial insulating layers 118, and the second barrier insulating layer 162 may not be disposed in the recess portion 118r. This is because, in the process of forming the first barrier insulating layer 161, a deposition process may be performed to have a relatively thick thickness as compared to FIG. 6A, or in the process of forming the recess portion 118r, a relatively smaller portion of the sacrificial insulating layers 118 may be removed.

Referring to FIG. 6C, the recess portion 118r of each of the sacrificial insulating layers 118 may not have an outwardly curved shape into the sacrificial insulating layers 118. As illustrated in FIG. 6C, the recess portion 118r may have a planar shape rather than a curved surface, or may have a curved shape including portions having different curvatures in example embodiments. The shape of the recess portion 118r may be varied depending on process conditions for removing the sacrificial insulating layers 118.

Figure 7:
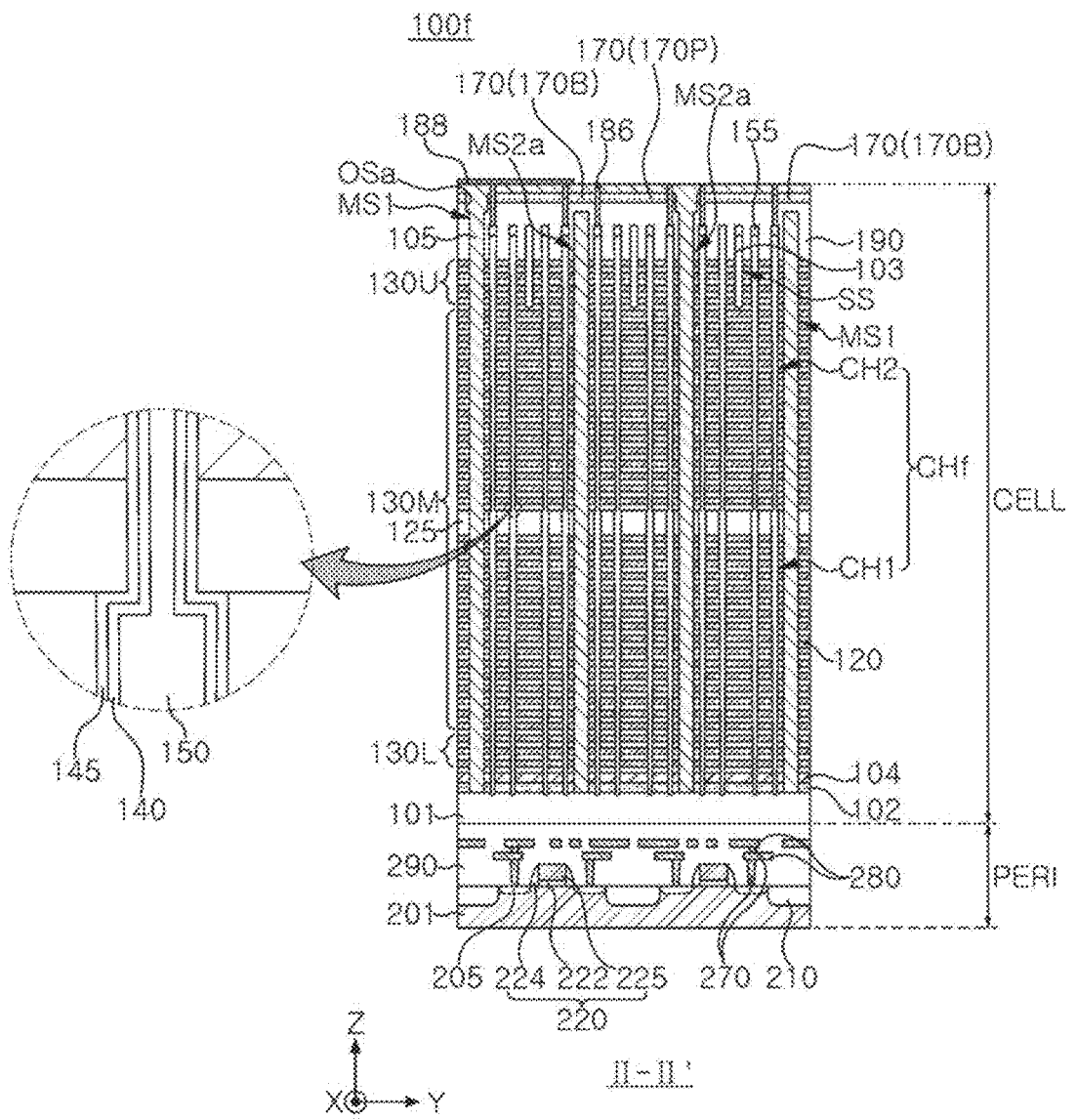
FIG. 7 is a cross-sectional diagram illustrating a semiconductor device according to an example embodiment.

FIG. 7 is a cross-sectional diagram illustrating a semiconductor device according to an example embodiment, taken along line II-II' in FIG. 1B.

Referring to FIG. 7, in the semiconductor device 100f, a stack structure of the gate electrodes 130 may include vertically stacked lower and upper stack structures, and the channel structures CHf may include vertically stacked first and second channel structures CH1 and CH2. The dummy channel structures DCH (see FIG. 2A) may also be disposed in the same manner as the channel structures CHf. The structure of the channel structures CHf may be introduced to provide stability when forming the channel structures CHf, for example when the number of the stacked gate electrodes 130 relatively is large.

The channel structures CHf may have a form in which the lower first channel structures CH1 and the upper second channel structures CH2 are connected to each other, and may have a bent portion due to a difference in width in the connection region. The channel layer 140, the dielectric layer 145, and the channel filling insulating layer 150 may be connected to each other between the first channel structure CH1 and the second channel structure CH2. The conductive pad 155 may be disposed only on the upper end of the upper second channel structure CH2. However, in example embodiments, each of the first channel structure CH1 and the second channel structure CH2 may include a conductive pad 155, and in this case, the conductive pad 155 of the first channel structure CH1 may be connected to the channel layer 140 of the second channel structure CH2. An upper interlayer insulating layer 125 having a relatively thick thickness may be disposed on the uppermost portion of the lower stack structure. However, the forms of the interlayer insulating layers 120 and the upper interlayer insulating layer 125 may be varied in example embodiments.

In example embodiments, the number of stack structures stacked in the z-direction and the number of channel structures may be varied.

Figure 8:
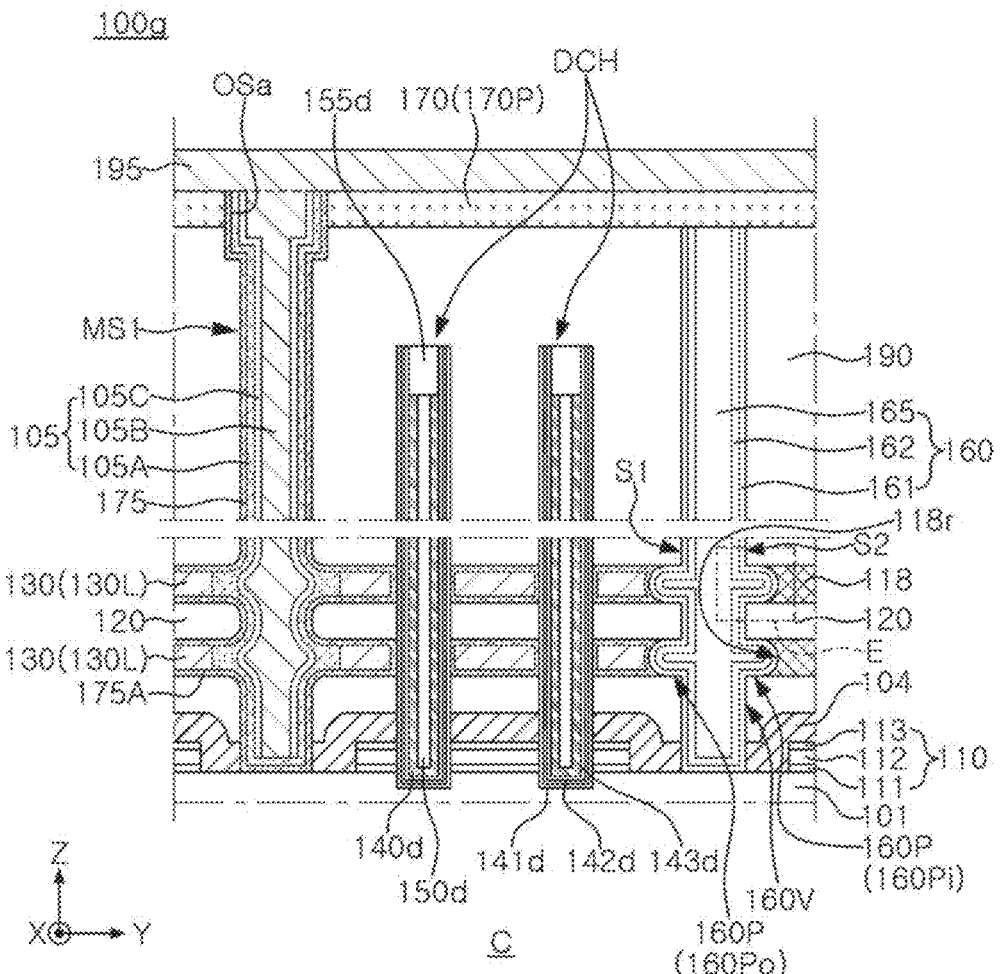
FIG. 8 is an enlarged diagram illustrating another semiconductor device according to an example embodiment.

FIG. 8 is an enlarged diagram illustrating another semiconductor device according to an example embodiment, illustrating a region corresponding to FIG. 4.

Referring to FIG. 8, in the semiconductor device 100g, the isolation insulating layer 105 may include first to third insulating layers 105A, 105B, and 105C. As compared to the semiconductor device 100 in FIG. 4, the isolation insulating layer 105 may further include a third insulating layer 105C disposed between the first and second insulating layers 105A and 105B. The third insulating layer 105C may include a material different from a material of the first and second insulating layers 105A and 105B. The third insulating layer 105C may include a nitride-based material such as silicon nitride.

In an example embodiment, the third insulating layer 105C may have a substantially uniform thickness.

Figure 9A:
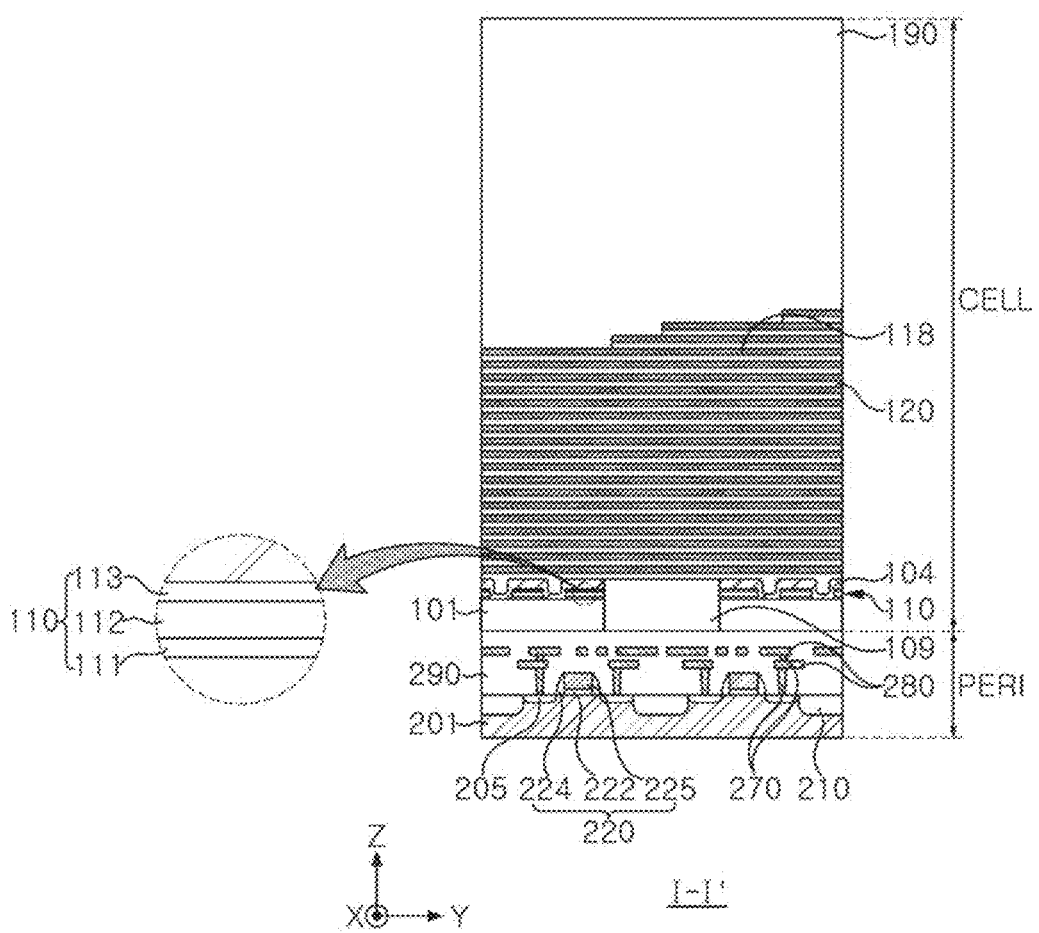
FIGS. 9A, 9B, 10A, 10B, 10C and 11 to 15 are cross-sectional diagrams illustrating a method of manufacturing a semiconductor device and enlarged diagrams illustrating a portion of the method according to an example embodiment.
Figure 15:
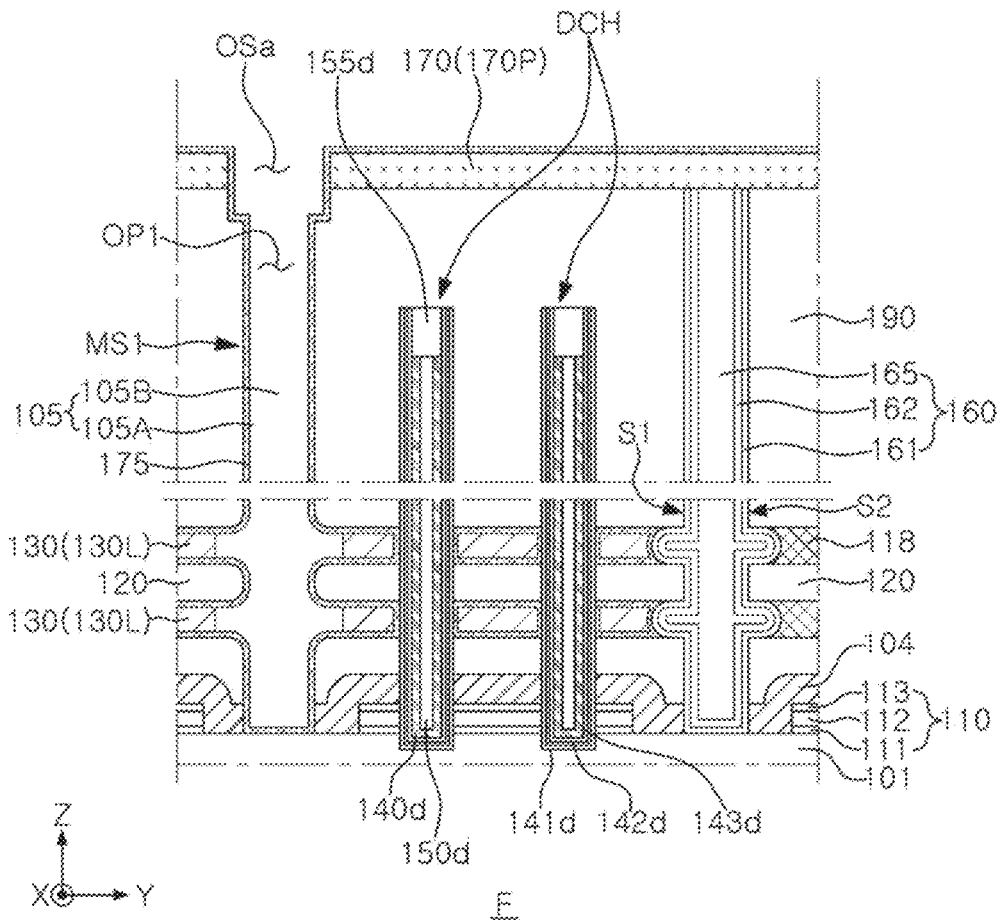

FIGS. 9A to 15 are cross-sectional diagrams illustrating a method of manufacturing a semiconductor device and enlarged diagrams illustrating a portion of the method according to an example embodiment. FIGS. 9A and 10A are cross-sectional diagrams taken along line I-I' in FIG. 1B, FIGS. 9B and 10B are cross-sectional diagrams taken along line III-III' in FIG. 1B, and FIG. 10C 15 to 15 are enlarged illustrating a region corresponding to region "F" in FIG. 10A.

Figure 9B:
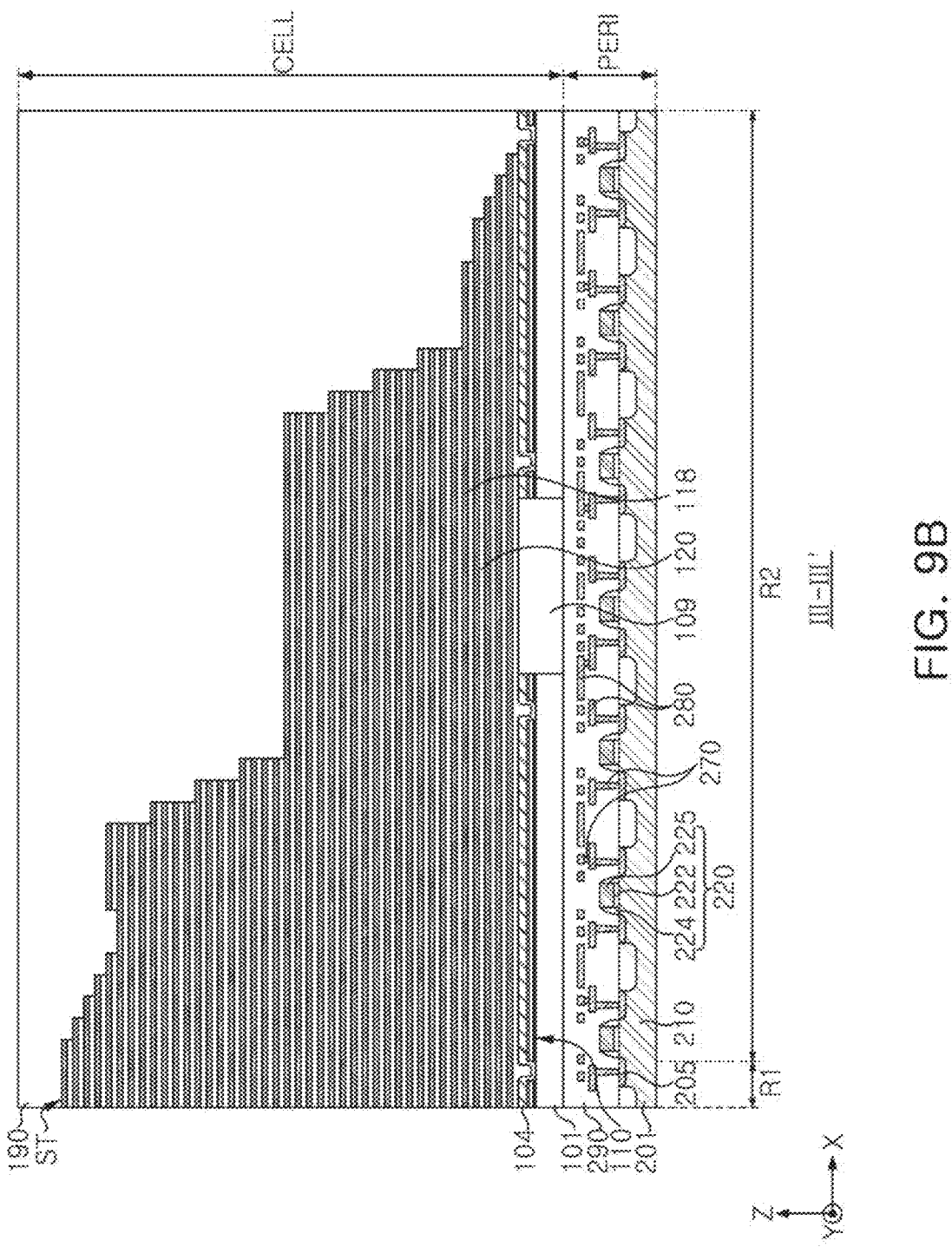

Referring to FIGS. 9A and 9B, a peripheral circuit structure PERI including circuit devices 220 and lower wiring structures may be formed on a first substrate 201, a second substrate 101, a horizontal insulating layer 110, a second horizontal conductive layer 104, and a substrate insulating layer 109 on which the memory cell structure CELL is provided may be formed, and sacrificial insulating layers 118 and interlayer insulating layers 120 may be alternately stacked.

First, device isolation layers 210 may be formed in the first substrate 201, and circuit gate dielectric layer 222 and circuit gate electrode 225 may be formed in order on the first substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon or a metal silicide layer, but an example embodiment thereof is not limited thereto. Thereafter, a spacer layer 224 and source/drain regions 205 may be formed on both sidewalls of the circuit gate dielectric layer 222 and the circuit gate electrode 225. In example embodiments, the spacer layer 224 may include a plurality of layers. Thereafter, the source/drain regions 205 may be formed by performing an ion implantation process.

Among the lower wiring structures, the circuit contact plugs 270 may be formed by partially forming the peripheral region insulating layer 290, removing a portion thereof by etching, and filling a conductive material. The circuit wiring lines 280 may be formed by, for example, depositing a conductive material and patterning the conductive material.

The peripheral region insulating layer 290 may include a plurality of insulating layers. A portion of the peripheral region insulating layer 290 may be formed in each process of forming the lower wiring structures, and a portion thereof may be formed on the uppermost circuit wiring lines 280, such that the peripheral region insulating layer 290 may cover the circuit devices 220 and the lower wiring structures.

Thereafter, the second substrate 101 may be formed on the peripheral region insulating layer 290. The second substrate 101 may be formed of, for example, polycrystalline silicon, and may be formed by a CVD process. Polycrystalline silicon included in the second substrate 101 may include impurities.

The first to third horizontal insulating layers 111, 112, and 113 included in the horizontal insulating layer 110 may be sequentially stacked on the second substrate 101. The horizontal insulating layer 110 may be partially replaced with the first horizontal conductive layer 102 in FIG. 3B through a subsequent process. The first and third horizontal insulating layers 111 and 113 may include a material different from a material of the second horizontal insulating layer 112. For example, the first and third horizontal insulating layers 111 and 113 may be formed of the same material as a material of the interlayer insulating layers 120, and the second horizontal insulating layer 112 may be formed of the same material as a material of the sacrificial insulating layers 118. The horizontal insulating layer 110 may be removed by a patterning process in a portion of regions.

The second horizontal conductive layer 104 may be formed on the horizontal insulating layer 110, and may be in contact with the second substrate 101 in a region from which the horizontal insulating layer 110 is removed. Accordingly, the second horizontal conductive layer 104 may be bent along end portions of the horizontal insulating layer 110, may cover the ends, and may extend to the second substrate 101.

The substrate insulating layer 109 may be formed by removing a portion of the second substrate 101, the horizontal insulating layer 110, and the second horizontal conductive layer 104 from the region corresponding to the through wiring region TR (see FIG. 3A) and filling an insulating material. The substrate insulating layer 109 may be formed throughout the entire region of the through wiring region TR or may be formed in a smaller region. After the insulating material is filled, a planarization process may be further performed using a chemical mechanical polishing (CMP) process. Accordingly, the upper surface of the substrate insulating layer 109 may be substantially coplanar with the upper surface of the second horizontal conductive layer 104.

Thereafter, the sacrificial insulating layers 118 and the interlayer insulating layers 120 may be alternately stacked. The sacrificial insulating layers 118 may be partially replaced with the gate electrodes 130 (see FIG. 3A) through a subsequent process. The sacrificial insulating layers 118 may be formed of a material different from a material of the interlayer insulating layers 120, and may be formed of a material which may be etched with etching selectivity for the interlayer insulating layers 120 under specific etching conditions. For example, the interlayer insulating layers 120 may be formed of at least one of silicon oxide and silicon nitride, and the sacrificial insulating layers 118 may be formed of a material different from a material of the interlayer insulating layers 120 selected from among silicon, silicon oxide, silicon carbide, and silicon nitride. In example embodiments, thicknesses of the interlayer insulating layers 120 may not be the same. The thicknesses of the interlayer insulating layers 120 and the sacrificial insulating layers 118 and the number of films included in the interlayer insulating layers 120 and the sacrificial insulating layers 118 may be varied from the illustrated examples.

Thereafter, a capping insulating layer 190 covering an upper portion of the stack structure of the sacrificial insulating layers 118 and the interlayer insulating layers 120 may be formed.

Figure 10A:
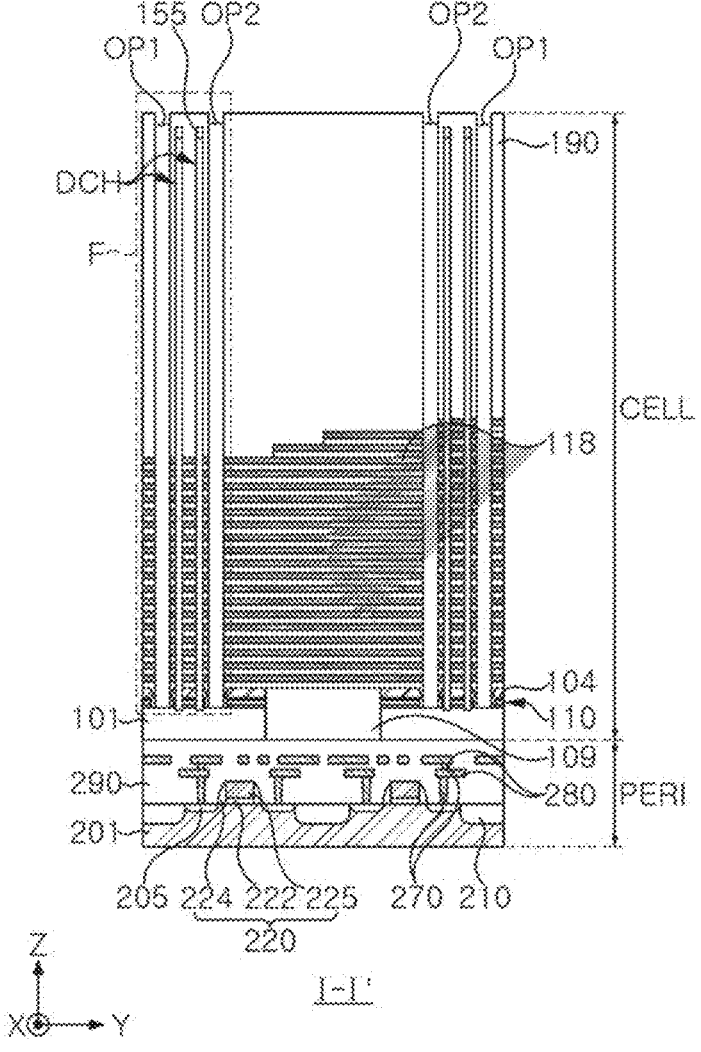
Figure 10B:
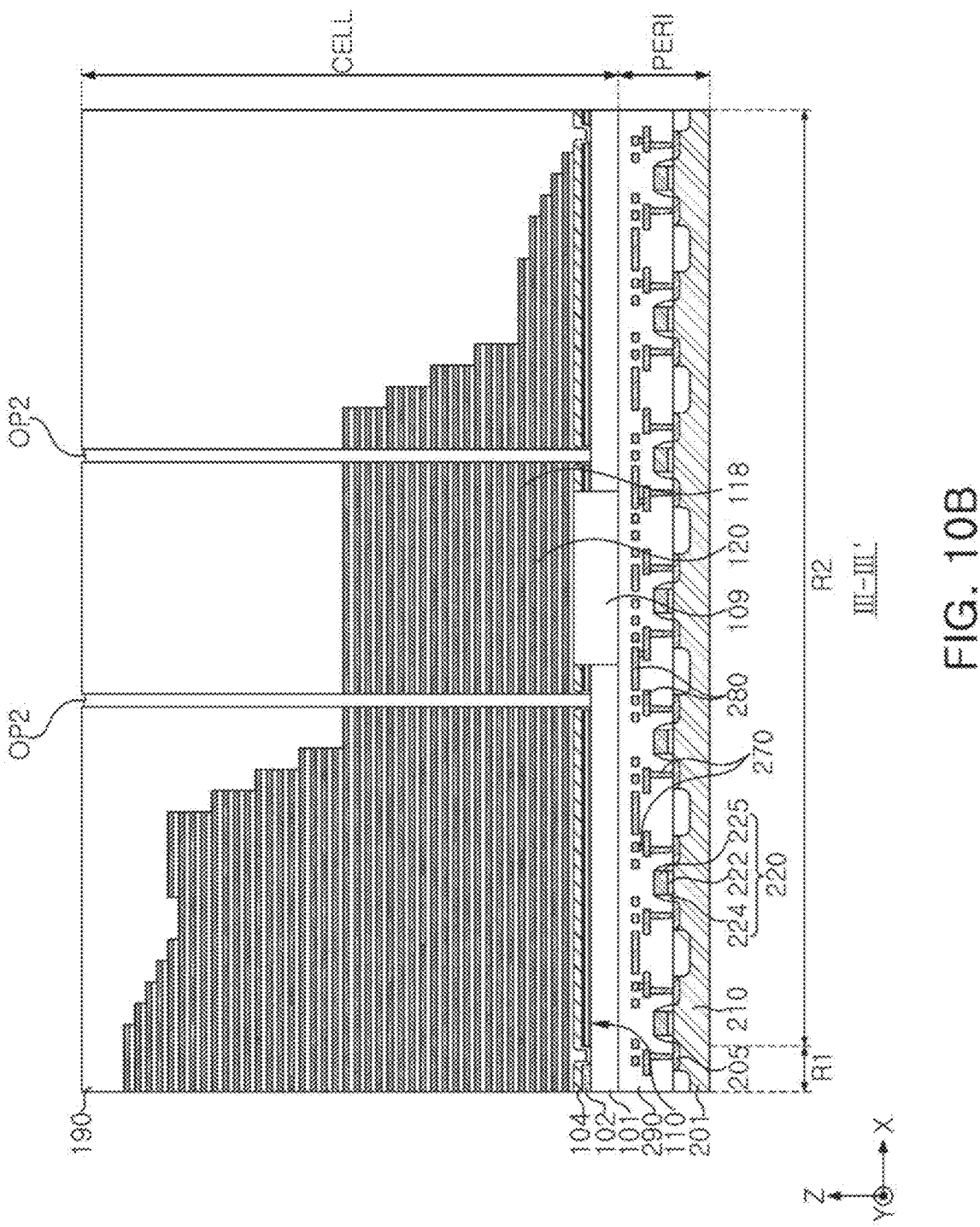
Figure 10C:
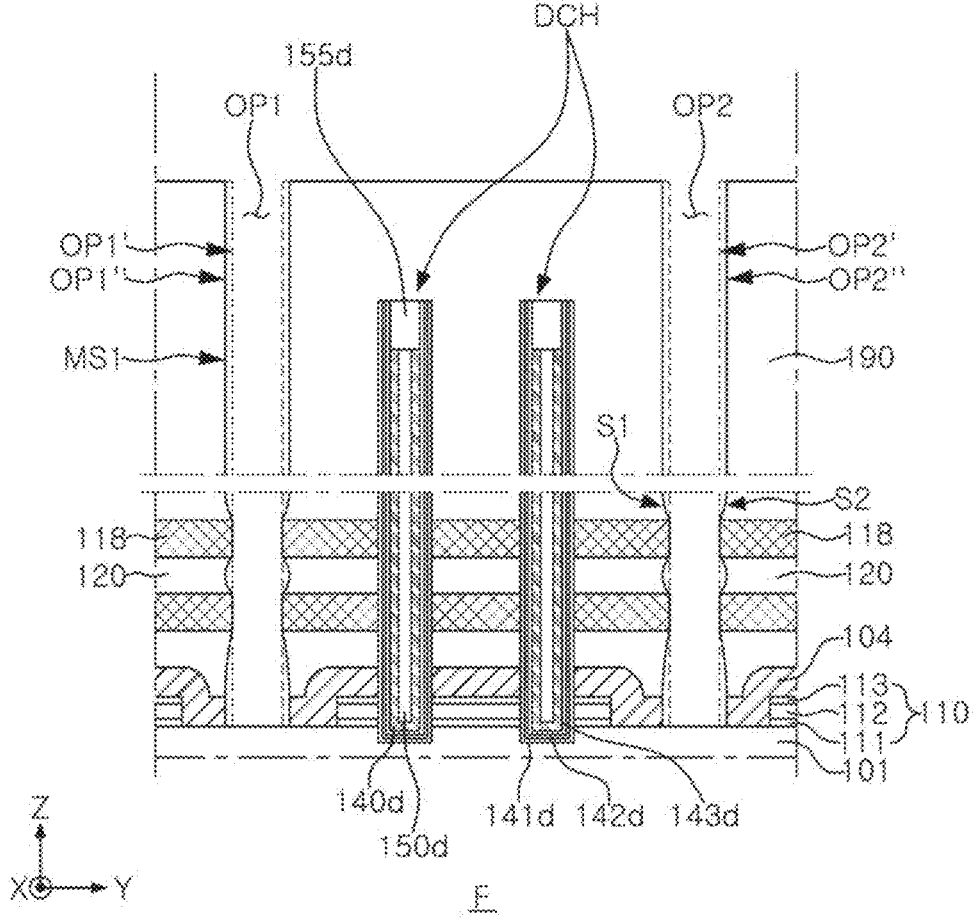

Referring to FIGS. 10A to 10C, channel structures CH (see FIG. 3B) and supporting structures DCH penetrating through the stack structure of the sacrificial insulating layers 118 and the interlayer insulating layers 120 may be formed, openings OP1 and OP2 penetrating through the stack structure may be formed, and the first horizontal conductive layer 102 may be formed.

First, the upper isolation region SS may be formed by removing a portion of the sacrificial insulating layers 118 and the interlayer insulating layers 120. The upper isolation region SS may be formed by exposing a region in which the upper isolation region SS is to be formed using a mask layer, removing a predetermined number of the sacrificial insulating layers 118 and the interlayer insulating layers 120 from the uppermost portion, and depositing an insulating material. The upper isolation region SS may extend in the z-direction to a region lower than the region in which the upper gate electrodes 130U in FIG. 3B are formed.

Thereafter, the channel structures CH and the support structures DCH may be formed by anisotropically etching the sacrificial insulating layers 118, the interlayer insulating layers 120, and the horizontal insulating layer 110, and may be formed by forming hole-shaped channel holes and filling the holes. In example embodiments, the support structures DCH may be formed to have a larger size than a size of the channel structures CH. Due to the height of the stack structure, sidewalls of the channel holes may not necessarily be perpendicular to the upper surface of the second substrate 101. The channel holes may be formed to be recessed into a portion of the second substrate 101.

Thereafter, the first horizontal conductive layer 102 may be formed by forming the openings OP1 and OP2, removing a portion of the horizontal insulating layers 110 exposed through the openings OP1 and OP2, and depositing a conductive material. Among the openings OP1 and OP2, the first openings OP1 may be formed in positions of the first and second isolation regions MS1, MS2a, and MS2b in FIG. 1A, and the second opening OP2 may be formed in a position of the barrier structure 160 in FIG. 1A. Before the openings OP1 and OP2 are formed, a capping insulating layer 190 may be further formed on the channel structures CH and the dummy channel structures DCH. The openings OP1 and OP2 may be formed by forming a mask layer using a photolithography process and anisotropically etching the stack structure. The first openings OP1 may be formed in a trench shape extending in the x-direction, and the second openings OP2 may be formed in a rectangular shape, a ring shape or a shape similar thereto.

The second horizontal insulating layer 112 may be exposed by an etch-back process while forming sacrificial spacer layers in the first openings OP1'. The exposed second horizontal insulating layer 112 may be selectively removed, and the upper and lower first and third horizontal insulating layers 111 and 113 may be removed. During the process of removing the horizontal insulating layer 110, a portion of the dielectric layer 142 exposed in the region from which the second horizontal insulating layer 112 is removed may also be removed. After the first horizontal conductive layer 102 is formed by depositing a conductive material in the region from which the horizontal insulating layer 110 is removed, the sacrificial spacer layers may be removed from the first openings OP1'. In the process of removing the sacrificial spacer layers, a portion of the interlayer insulating layers 120 may be removed together, such that a width of a portion of regions of the first openings OP1" may increase. Accordingly, widths of the first openings OP1" on a level parallel to the sacrificial insulating layers 118 may be different from widths of the first openings OP1" on a level parallel to the interlayer insulating layers 120. The second openings OP2" may have a structure the same as or similar to the structure described with reference to the first openings OP1".

Figure 11:
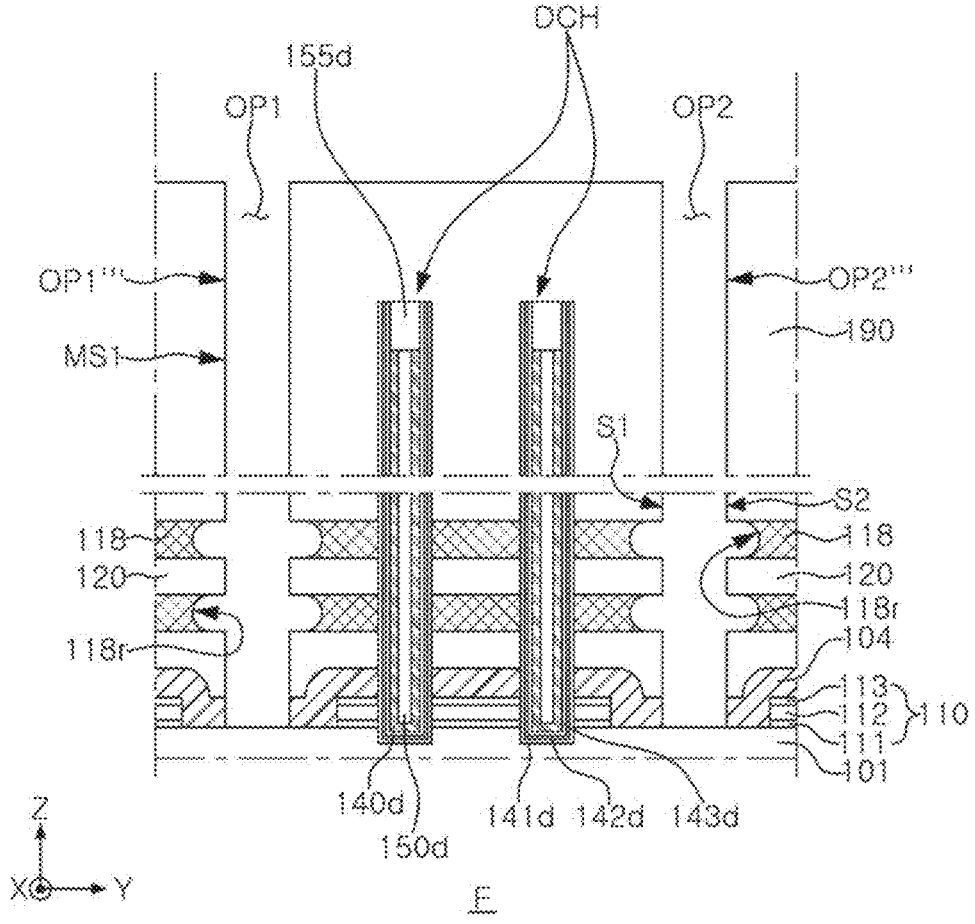

Referring to FIG. 11, a portion of the sacrificial insulating layers 118 exposed through the openings OP1, OP2 may be removed.

The recess portion 118r may be formed in each of the sacrificial insulating layers 118 by performing an etching process for removing a portion of the sacrificial insulating layer 118 exposed through the first and second openings OP1 and OP2. The etching process may be of selectively removing the sacrificial insulating layer 118 with respect to the interlayer insulating layer 120 under predetermined etching conditions. The etching process may be an etching process using phosphoric acid, for example. Depending on the type and conditions of the etching process, various recess portions 118r in FIGS. 6A to 6C may be formed.

By performing the etching process, widths of the first openings OP1''' on a level that parallel to the sacrificial insulating layers 118 may be greater than the widths of the first openings OP1''' on a level parallel to the interlayer insulating layer 120. Accordingly, in the subsequent process in FIGS. 12 and 13, the side portion of the interlayer insulating layer 120 may be formed to be rounded.

The second openings OP2''' may have a structure the same as or similar to the structure described with the first openings OP1".

Referring to FIG. 12, a barrier structure 160 and an upper support structure 170 may be formed.

First, the first barrier insulating layer 161, the second barrier insulating layer 162, and the gap pill layer 165 may be formed in the second opening portion OP2. Also, the first to third sacrificial 161', 162', and 165' may be formed in order in the first openings OP1. Thicknesses of the first and second barrier insulating layers 161 and 162 may be formed to be thinner than a thickness of the gap pill layer 165. The first and second barrier insulating layers 161 and 162 may include different materials. For example, the first barrier insulating layer 161 may include silicon oxide, and the second barrier insulating layer 162 may include silicon nitride. The gap pill layer 165 may include a semiconductor material such as a second barrier insulating layer 162 and a different material such as silicone. Thereafter, a barrier structure 160 including first and second barrier insulating layers 161 and 162 and a gap pill layer 165 in the second open portion OP2 may be formed by performing a planarization process using a chemical mechanical polishing process. In an example embodiment, the barrier structure 160 may have a plurality of protruding portions 160p extending into the recess portion 118r. For example, the first barrier insulating layer 161 may cover the recess portion 118r and may be in contact with the sacrificial insulating layer 118.

Thereafter, the upper support structure 170 may be formed by depositing an insulating material on the capping insulating layer 190 and performing a patterning process. Through the patterning process, the through-region OSa and OSb may be formed in positions corresponding to the upper portion of the first and second separate regions MS1, MS2a, and MS2b. The capping insulating layer 190 may be further formed on the first and second separate regions MS1, MS2a, and MS2b before the penetration regions OSa and OSb are formed. The penetration regions OSa and OSb may be formed by forming a mask layer using a photolithography process and etching the insulating material. In the process of etching the insulating material, the capping insulating layer 190 may also be partially etched. By forming the penetration regions OSa and OSb, the upper support structure 170 including the support patterns 170P and the bridge patterns 170B may be formed. In example embodiments, the depths of the penetration regions OSa and OSb may be varied. For example, the penetration regions OSa and OSb may be formed to have a depth deeper than the illustrated example, such that the lower end thereof may be disposed on a level lower than a level of the upper surface of the support structure DCH. For example, the penetration regions OSa and OSb may be formed to have a thickness smaller than the illustrated examples, and the lower end may be disposed on substantially the same level as a level of the lower surface of the support patterns 170P. The support patterns 170P may include insulating materials such as silicon oxide or silicone nitride, silicon oxide, or tetraethyl orthosilicate (TEOS).

As the penetration regions OSa and OSb are formed, the first to third sacrificial 161', 162', and 165', which are disposed in regions corresponding to the first and second separators MS1, MS2a, and MS2b, may be exposed.

Referring to FIG. 13, the first to third sacrificial 161', 162', and 163' may be removed.

An etching process may be performed on the first to third sacrificial 161', 162', and 165' exposed through the penetration regions OSa and OSb. The etching process may include, for example, a first etching process for removing the third sacrificial 165', a second etching process for removing the second sacrificial layer 162', and a third etching process for removing the first sacrificial layer 161', but the number and conditions of the etching process may be varied in example embodiments. In the etching process, the first openings OP1"" having a width greater than the width of the previous first openings OP''' (see FIG. 11) may be formed. This may be because the interlayer insulating layer 120 may be removed in the etching process for removing the first sacrificial 161. In the etching process, the edges of the interlayer insulating layer 120 exposed through the recess portion 118r may be etched relatively more than the other regions, such that the interlayer insulating layer 120 having a rounded side portion may be formed. Accordingly, the distance between the interlayer insulating layer 120 may increase toward the first and second isolation regions MS1, MS2a, and MS2b.

Referring to FIG. 14, the tunnel portions TL may be formed by removing the sacrificial insulating layer 118.

The sacrificial insulating layer 118 may be removed from the external side of the through wiring region TR (see FIG. 2A). In the through wiring region TR, the sacrificial insulating layer 118 may remain and may form an insulating region IR of the through wiring region TR together with the interlayer insulating layer 120 and the substrate insulating layer 109. The sacrificial insulating layer 118 may be selectively removed with respect to the interlayer insulating layer 120, the second horizontal conductive layer 104, the substrate insulating layer 109, and the barrier structure 160 using wet etching. Accordingly, a plurality of tunnel portions TL may be formed between the interlayer insulating layer 120. In the wet etching process, a portion of the interlayer insulating layer 120 may be etched together such that an interlayer insulating layer 120 having a rounded side portion may be formed. In an example embodiment, the rounded side portion of the interlayer insulating layer 120 may be defined by the process of etching the first sacrificial layer 161' in FIG. 13 and the process of etching the sacrificial insulating layer 118 in FIG. 14, or the shape of the side portion may be defined by one of the etching processes. The shape of the side portion may be formed to have a rounded shape by exposing at least a portion of the upper and lower surfaces of the interlayer insulating layers 120 by preferentially performing the process of forming the recess portion 118r in FIG. 12, and adjusting a curvature in a subsequent process.

Referring to FIG. 15, the gate electrode 130 may be formed.

The gate electrode 130 may be formed by forming the metal oxide layer 175 in the tunnel portion TL through the first openings OP1 and the penetration regions OSa and OSb, and filling a conductive material therein.

The metal oxide layer 175 may conformally cover inner walls of the tunnel portion TL. The metal oxide layer 175 may extend in the Z-direction along the side surface of the first openings OP1 while covering inner walls of the tunnel portion TL. The metal oxide layer 175 may extend to the upper surface of the support patterns 180p while covering the side surfaces of the penetration regions OSa and OSb. In example embodiments, the metal oxide layer 175 may include a plurality of layers. In an example embodiment, the process of forming the metal oxide layer 175 may not be performed.

At least one surface of the gate electrodes 130 may be covered by the metal oxide layer 175 in the tunnel portion TL. The metal oxide layer 175 covering at least one surface of the gate electrodes 130 may be referred to as a blocking layer. The conductive material forming the gate electrode 130 may fill the tunnel portion TL. The conductive material may include a metal, polycrystalline silicone or metal silicide material. The barrier structure 160 may prevent a conductive material from entering the through wiring region TR when the gate electrode 130 is formed. After the gate electrodes 130 are formed, the conductive material deposited in the first openings OP1 may be removed through an additional process. Accordingly, the side surface of the gate electrodes 130 exposed to the first openings OP1 may be further recessed inwardly than the side surface of the first openings OP1. Depending on the process conditions of the process, the depth of recess portion may be adjusted.

Thereafter, by reference to FIGS. 1A to 4, the isolation insulating layer 105 may be formed, the upper insulating layer 195 may be formed, and the wiring line 188 may be formed.

The isolation insulating layer 105 filling the penetration regions OSa and OSb and the first openings OP1 may be formed. The isolation insulating layer 105 may include a first insulating layer 105A and a second insulating layer 105B on the first insulating layer 105A. The first insulating layer 105A may be conformally formed on the metal oxide layer 175 covering the internal side surfaces of the first opening OP1 and the penetration regions OSa and OSb. The first insulating layer 105A may be formed by performing an atomic layer deposition process (ALD) process. The boundary surface between the first insulating layer 105A and the second insulating layer 105B of the isolation insulating layer 105 may be distinct or indistinct. In example embodiments, the third insulating layer 105C (see FIG. 8) formed of nitride may be formed between the first and second insulating layers 105A and 105B. Thereafter, the isolation insulating layer 105 on the support pattern 170P may be removed by performing a planarization process. Thereafter, the upper insulating layer 195 may be formed, and via holes penetrating the upper insulating layer 195 may be formed. The via holes may expose the circuit wiring lines 280 of the peripheral circuit structure PERI on a lower end. In this process, holes for forming the gate contact plugs 185 connected to the gate electrode 130 may also be formed together. A through contact plug 180 and/or gate contact plugs 185 may be formed by filing the via holes with a conductive material.

Thereafter, a wiring via may be formed by filling the via holes exposing the upper surfaces of the gate contact plug 185 and/or the channel structure CH with a conductive material, and wiring lines 188 in contact with the wiring via may be formed. In example embodiments, the wiring via and wiring lines 188 may be integrally formed. Accordingly, the semiconductor device 100 may be provided.

Figure 16:
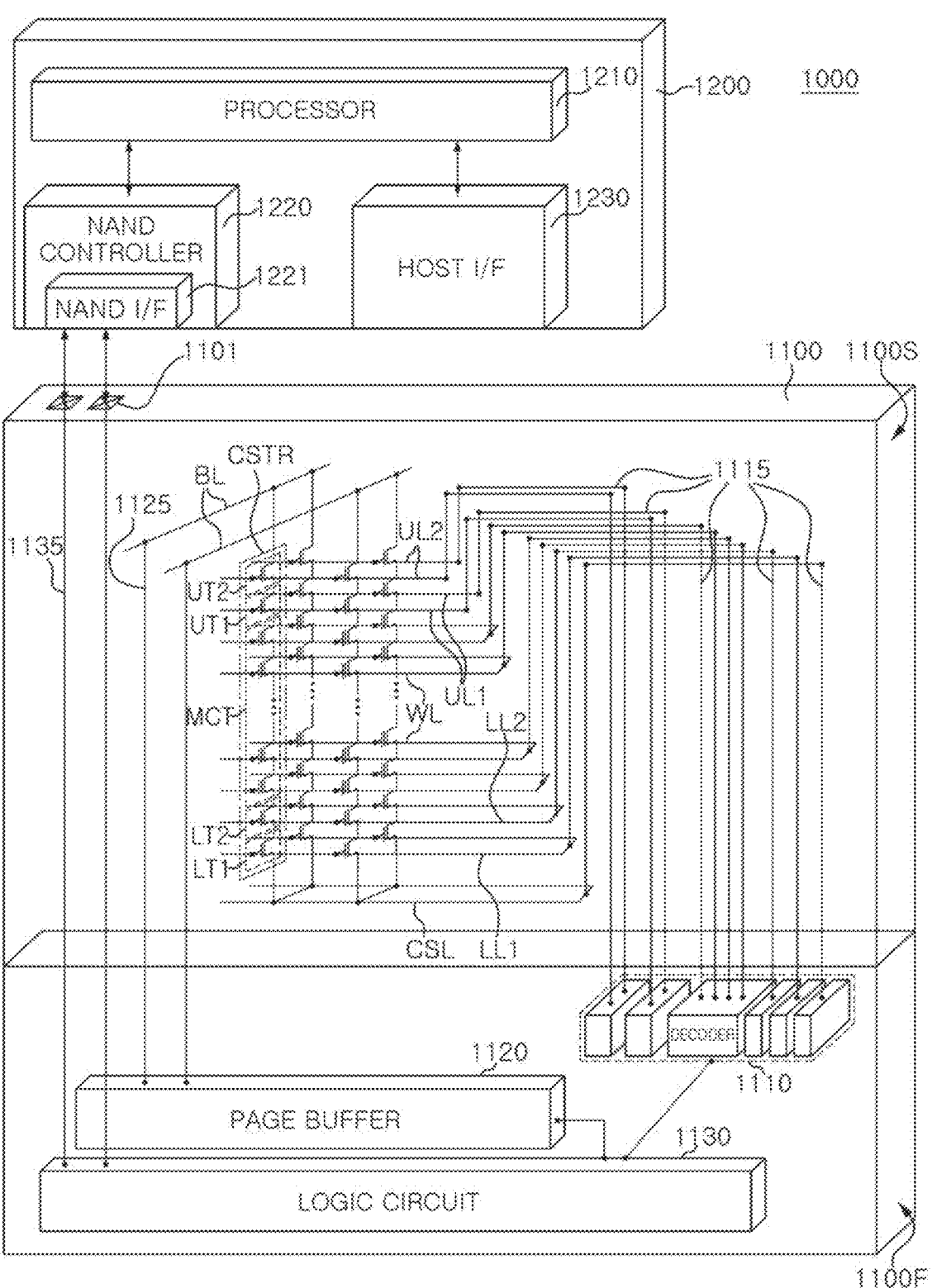
FIG. 16 is a diagram illustrating a data storage system including a semiconductor device according to an example embodiment.

FIG. 16 is a diagram illustrating a data storage system including a semiconductor device according to an example embodiment.

Referring to FIG. 16, the data storage system 1000 may include a semiconductor device 1100 and a controller 1200 electrically connected to the semiconductor device 1100. The data storage system 1000 may be a storage device including one or a plurality of semiconductor devices 1100 or an electronic device including a storage device. For example, the data storage system 1000 may be a solid state drive device (SSD) including one or a plurality of semiconductor devices 1100, a universal serial bus (USB), a computing system, a medical device, or a communication device.

The semiconductor device 1100 may be a non-volatile memory device, for example, the NAND flash memory device described above with reference to FIGS. 1 to 8. The semiconductor device 1100 may include a first structure 1100F and a second structure 1100S on the first structure 1100F. In example embodiments, the first structure 1100F may be disposed thereafter to the second structure 1100S. The first structure 1100F may be a peripheral circuit structure including a decoder circuit 1110, a page buffer 1120, and a logic circuit 1130. The second structure 1100S may include a bit line BL, a common source line CSL, word lines WL, first and second gate upper lines UL1 and UL2, and first and second gate lower lines. The memory cell structure may include memory cell strings CSTR between the bits LL1 and LL2 and the bit line BL and the common source line CSL.

In the second structure 1100S, each of the memory cell strings CSTR may include lower transistors LT1 and LT2 adjacent to the common source line CSL, and upper transistors adjacent to the bit line BL. Each of the memory cell strings CSTR may also include upper transistors UT1 and UT2 and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT2 may be used in an erase operation for erasing data stored in the memory cell transistors MCT using the GIDL phenomenon.

The common source line CSL, the first and second gate lower lines LL1 and LL2, the word lines WL, and the first and second gate upper lines UL1 and UL2 may be electrically connected to the decoder circuit 1110 through first connection wires 1115 extending from the first structure 1100F to the second structure 1100S. The bit lines BL may be electrically connected to the page buffer 1120 through second connection lines 1125 extending from the first structure 110F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through the input/output pad 1101 electrically connected to the logic circuit 1130. The input/output pad 1101 may be electrically connected to the logic circuit 1130 through an input/output connection line 1135 extending from the first structure 1100F to the second structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1100.

The processor 1210 may control the overall operation of the data storage system 1000 including the controller 1200. The processor 1210 may operate according to a predetermined firmware, and may access the semiconductor device 1100 by controlling the NAND controller 1220. The NAND controller 1220 may include a controller interface 1221 that processes communication with the semiconductor device 1100. Through the controller interface 1221, a control command for controlling the semiconductor device 1100, data to be written to the memory cell transistors MCT of the semiconductor device 1100, and data read from the memory cell transistors may be transmitted. The host interface 1230 may provide a communication function between the data storage system 1000 and an external host. When receiving a control command from an external host through the host interface 1230, the processor 1210 may control the semiconductor device 1100 in response to the control command.

Figure 17:
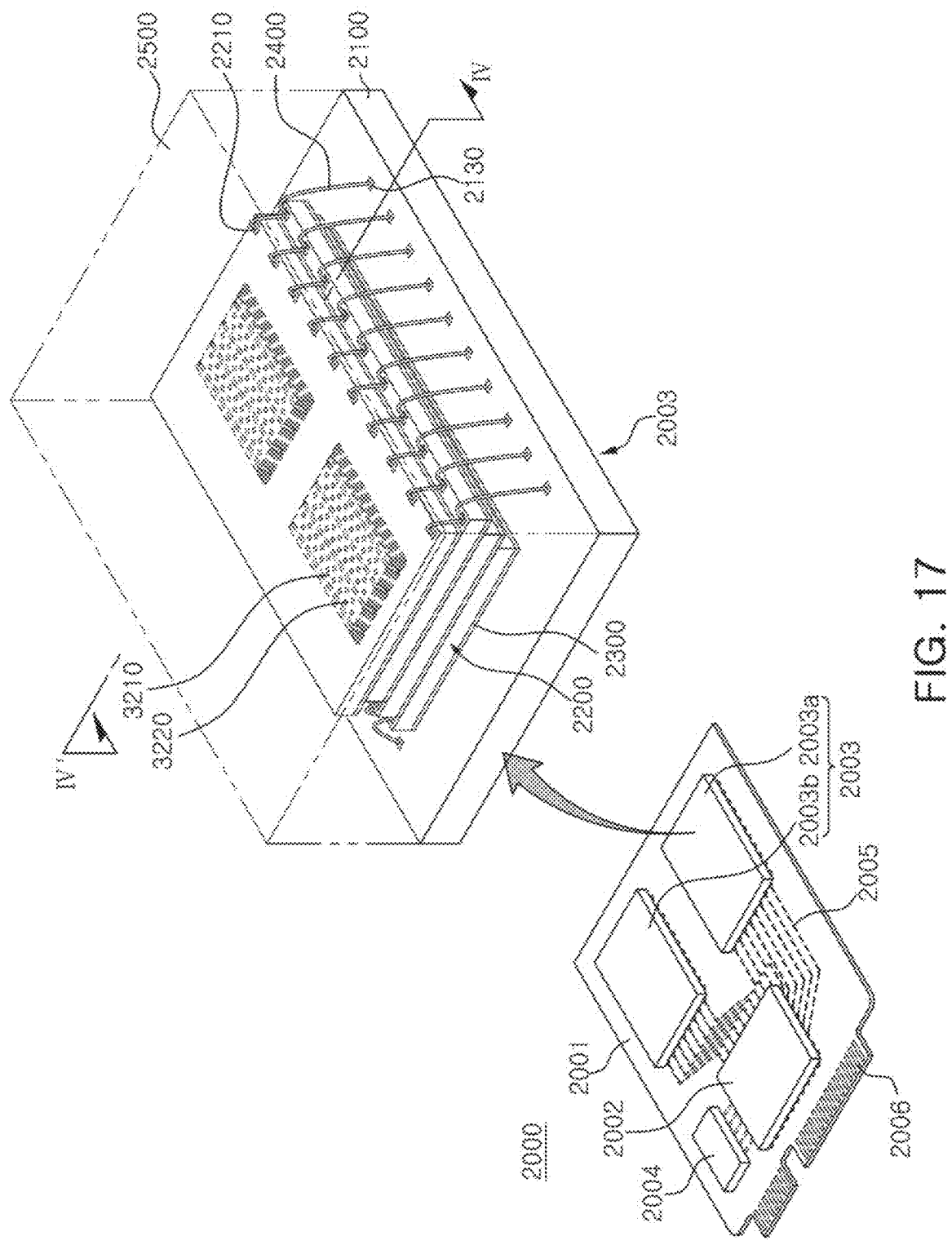
FIG. 17 is a perspective diagram illustrating a data storage system including a semiconductor device according to an example embodiment and FIG. 18 is a cross-sectional diagram illustrating a semiconductor package according to an example embodiment.

FIG. 17 is a diagram illustrating a data storage system including a semiconductor device according to an example embodiment.

Referring to FIG. 17, a data storage system 1000 may include a semiconductor device 1100 and a controller 1200 electrically connected to the semiconductor device 1100. The semiconductor package 2003 and the DRAM 2004 may be connected to the controller 2002 by wiring patterns 2005 formed on a main substrate 2001.

The main substrate 2001 may include a connector 2006 including a plurality of pins coupled to an external host. The number and arrangement of the plurality of pins in the connector 2006 may vary depending on a communication interface between the data storage system 2000 and the external host. In example embodiments, the data storage system 2000 may communicate with an external host according to one of interfaces from among universal serial bus (USB), peripheral component interconnect express (PCI-Express), serial advanced technology attachment (SATA), M-Phy for universal flash storage (UFS). In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or may read data from the semiconductor package 2003, and may improve an operating speed of the data storage system 2000.

The DRAM 2004 may be configured as a buffer memory for alleviating a difference in speeds between the semiconductor package 2003, which is a data storage space, and an external host. The DRAM 2004 included in the data storage system 2000 may operate as a cache memory, and may provide a space for temporarily storing data in a control operation for the semiconductor package 2003. When the data storage system 2000 may include the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include an input/output pad 2210. The input/output pad 2210 may correspond to the input/output pad 1101 in FIG. 16. Each of the semiconductor chips 2200 may include gate stack structures 3210 and channel structures 3220. Each of the semiconductor chips 2200 may include the semiconductor device described in the aforementioned example embodiment with reference to FIGS. 1 to 8.

In example embodiments, the connection structure 2400 may be configured as a bonding wire electrically connecting the input/output pad 2210 to the upper package pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure including a through-electrode (TSV) instead of the connection structure 2400 of a bonding wire method.

In example embodiments, the controller 2002 and the semiconductor chips 2200 may be included in a single package. In an example embodiment, the controller 2002 and the semiconductor chips 2200 may be mounted on a separate interposer substrate different from the main substrate 2001, and the controller 2002 and the semiconductor chips 2200 may be connected to each other interconnection formed on the interposer substrate.

Figure 18:
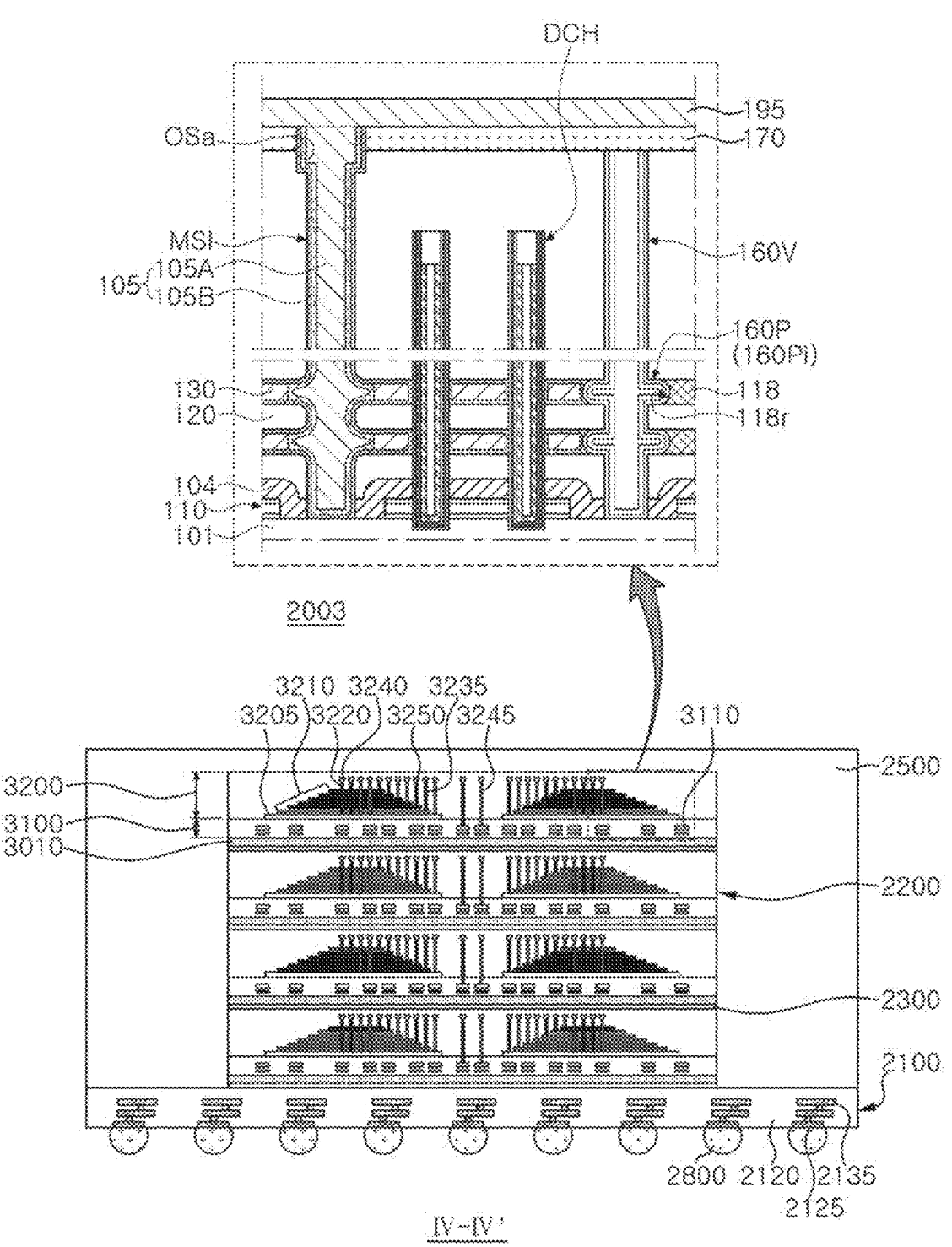

FIG. 18 is a cross-sectional diagram illustrating a semiconductor package according to an example embodiment. FIG. 18 illustrates an example of the semiconductor package 2003 in FIG. 17, taken along line IV-IV' in FIG. 17.

Referring to FIG. 17, in the semiconductor package 2003, the package substrate 2100 may be implemented as a printed circuit board. The package substrate 2100 may include a package substrate body 2120, package upper pads 2130 (see FIG. 16) disposed on the upper surface of the package substrate body 2120, lower pads 2125 disposed on the lower surface of the package substrate body 2120 or exposed through the lower surface, and internal interconnections 2135 electrically connecting the upper pads 2130 to the lower pads 2125 in the package substrate body 2120. The lower pads 2125 may be connected to the interconnection patterns 2005 of the main substrate 2010 of the data storage system 2000 as illustrated in FIG. 16 through conductive connection portions 2800.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 penetrating through the gate stack structure 3210, bit lines 3240 electrically connected to the memory channel structures 3220, and contact plugs 3235 electrically connected to the word lines WL (see FIG. 16) of the gate stack structure 3210. As described above with reference to FIGS. 1 to 8, in each of the semiconductor chips 2200, the barrier structure 160 may have a plurality of protrusions 160P, and each of the sacrificial insulating layers 118 in the through wiring region TR may have the recess portion 118r.

Each of the semiconductor chips 2200 may include a through interconnection 3245 electrically connected to the peripheral interconnections 3110 of the first structure 3100 and extending into the second structure 3200. The through interconnection 3245 may be disposed on an external side of the gate stack structure 3210, and may be further disposed to penetrate through the gate stack structure 3210. Each of the semiconductor chips 2200 may further include an input/output pad 2210 (see FIG. 16) electrically connected to the peripheral interconnections 3110 of the first structure 3100.

According to the aforementioned example embodiments, by adding an etching process for removing a portion of the sacrificial insulating layers before forming the gate electrodes through the openings for exposing the isolation regions, a semiconductor device having improved productivity and improved reliability, such as improving quality of the gate electrode, and a data storage system including the same may be provided.

While aspects of example embodiments have been particularly shown and described, it will be understood that various changes in form and details may be made therein without departing from the spirit and scope of the following claims.

What is claimed is:

1. A semiconductor device, comprising:
a peripheral circuit structure comprising a first substrate and circuit devices on the first substrate;
a memory cell structure on the peripheral circuit structure;
a through wiring region on the peripheral circuit structure; and
a barrier structure surrounding a side surface of the through wiring region,
wherein the memory cell structure comprises:
a second substrate having a first region and a second region;
gate electrodes and first interlayer insulating layers that are alternately stacked so the gate electrodes are spaced apart from each other in a vertical direction perpendicular to an upper surface of the second substrate on the first region of the second substrate, the gate electrodes extending from the first region to the second region, and forming a step shape on the second region;
a channel structure penetrating through the gate electrodes on the first region and comprising a channel layer; and
isolation regions penetrating through the gate electrodes,
wherein the through wiring region comprises:
second interlayer insulating layers and sacrificial insulating layers alternately stacked on the second region; and
a through contact plug penetrating through the second interlayer insulating layers and the sacrificial insulating layers, and electrically connected to the circuit devices,
wherein a plurality of inner protrusions of the barrier structure respectively extend into recess portions of the sacrificial insulating layers that are horizontally recessed from the barrier structure toward the sacrificial insulating layers.

2. The semiconductor device of claim 1, wherein the recess portions have an inwardly curved shape that extends from the barrier structure toward each of the sacrificial insulating layers.

3. The semiconductor device of claim 1, wherein a depth of a recess portion is in a range of about 10 nm to about 60 nm.

4. The semiconductor device of claim 1, wherein the barrier structure comprises an external side surface opposing the gate electrodes and an internal side surface, and
wherein the plurality of inner protrusions of the barrier structure respectively extend from the internal side surface into the recess portions of the sacrificial insulating layers.

5. The semiconductor device of claim 4, wherein the plurality of inner protrusions are provided on substantially a same level as a level of the gate electrodes.

6. The semiconductor device of claim 4, wherein a plurality of outer protrusions of the barrier structure extend from the external side surface toward the gate electrodes.

7. The semiconductor device of claim 6, wherein a length of each of the plurality of inner protrusions is substantially equal to a length of each of the plurality of outer protrusions.

8. The semiconductor device of claim 1, wherein the barrier structure comprises a gap-fill layer, a first barrier insulating layer, and a second barrier insulating layer, wherein the gap-fill layer is provided in a central region of the barrier structure, wherein the first barrier insulating layer covers side surfaces and a bottom surface of the gap-fill layer, and wherein the second barrier insulating layer covers an external side surface and a bottom surface of the first barrier insulating layer.

9. The semiconductor device of claim 8, wherein the second barrier insulating layer is in contact with a recess portion of each of the sacrificial insulating layers.

10. The semiconductor device of claim 1, further comprising an isolation insulating layer in the isolation regions, wherein the isolation insulating layer comprises a first insulating layer covering sidewalls and a bottom surface of the isolation regions, a second insulating layer filling the isolation regions on the first insulating layer, and a third insulating layer provided between the first insulating layer and the second insulating layer, and wherein the third insulating layer comprises a material different from materials of the first insulating layer and the second insulating layer.

11. The semiconductor device of claim 1, wherein the memory cell structure further comprises an upper support structure on the gate electrodes, and wherein the upper support structure comprises penetration regions overlapping at least a portion of the isolation regions in the vertical direction.

12. The semiconductor device of claim 1, wherein the memory cell structure further comprises:

a first horizontal conductive layer on the first region of the second substrate;

a horizontal insulating layer spaced apart from the first horizontal conductive layer on the second region of the second substrate; and a second horizontal conductive layer covering the first horizontal conductive layer and the horizontal insulating layer, extending between the first horizontal conductive layer and the horizontal insulating layer, and contacting the second substrate, and wherein the first horizontal conductive layer is in contact with the channel layer.

13. The semiconductor device of claim 1, wherein each of the first interlayer insulating layers has a first portion having a first thickness and a second portion having a thickness decreasing from the first portion toward the isolation regions.

14. The semiconductor device of claim 13, wherein the gate electrodes completely overlap the first portion of the first interlayer insulating layers in the vertical direction.

15. A semiconductor device, comprising:

a peripheral circuit structure comprising a first substrate; and a memory cell structure on the peripheral circuit structure, wherein the memory cell structure comprises:

a second substrate having a first region and a second region;

a first horizontal conductive layer on the first region of the second substrate;

a horizontal insulating layer on the second region of the second substrate and spaced apart from the first horizontal conductive layer;

a second horizontal conductive layer covering the first horizontal conductive layer and the horizontal insulating layer;

gate electrodes and first interlayer insulating layers that are alternately stacked so the gate electrodes are spaced apart from each other in a vertical direction perpendicular to an upper surface of the second substrate on the second horizontal conductive layer, the gate electrodes forming a step shape on the second region;

a channel structure extending in the vertical direction on the first region, penetrating through the gate electrodes and the first interlayer insulating layers, and comprising a channel layer;

isolation regions penetrating through the gate electrodes and the first interlayer insulating layers, extending in a first horizontal direction, and spaced apart from each other in a second horizontal direction perpendicular to the first horizontal direction;

an upper support structure on the gate electrodes and having through-regions on the isolation regions; and a barrier structure provided to surround a through wiring region, wherein the through wiring region comprising comprises second interlayer insulating layers and sacrificial insulating layers alternately stacked on the second region, wherein a plurality of inner protrusions of the barrier structure respectively extend into recess portions of the sacrificial insulating layers, wherein each of the first interlayer insulating layers comprises a first portion having a first thickness and a second portion having a thickness that decreases with increasing distance from the first portion toward the isolation regions, and wherein a boundary surface between the first portion and the second portion is vertically offset from side surfaces of the gate electrodes.

16. The semiconductor device of claim 15, further comprising a through contact plug penetrating through the second interlayer insulating layers and the sacrificial insulating layers, and electrically connecting circuit devices provided on the first substrate to each other.

17. The semiconductor device of claim 16, wherein a length of the second portion is substantially equal to a length of each of the plurality of inner protrusions.

18. A data storage system, comprising:

a semiconductor storage device comprising a peripheral circuit structure which comprises a first substrate and circuit devices on the first substrate, a through wiring region on the peripheral circuit structure, a barrier structure surrounding a side surface of the through wiring region, and an input/output pad electrically connected to the circuit devices; and a controller electrically connected to the semiconductor storage device through the input/output pad and configured to control the semiconductor storage device, wherein the semiconductor storage device comprises:

a second substrate having a first region and a second region;

gate electrodes and first interlayer insulating layers that are alternately stacked so the gate electrodes are spaced apart from each other in a vertical direction perpendicular to an upper surface of the second substrate on the first region of the second substrate, the gate electrodes extending from the first region to the second region, and forming a step shape on the second region;

a channel structure penetrating through the gate electrodes on the first region and comprising a channel layer; and isolation regions penetrating through the gate electrodes,

wherein the through wiring region comprises:

second interlayer insulating layers and sacrificial insulating layers alternately stacked on the second region; and a through contact plug penetrating through the second interlayer insulating layers and the sacrificial insulating layers, and electrically connected to the circuit devices, and wherein the barrier structure comprises a plurality of protrusions extending from an internal side surface of the barrier structure into recess portions of the sacrificial insulating layers that are horizontally recessed from the barrier structure toward the sacrificial insulating layers.

19. The data storage system of claim 18, wherein each of the plurality of protrusions has an outwardly curved shape that extends toward the sacrificial insulating layers.

20. The data storage system of claim 18, wherein the barrier structure comprises a gap-fill layer, a first barrier insulating layer, and a second barrier insulating layer, wherein the gap-fill layer is provided in a central region of the barrier structure, wherein the first barrier insulating layer covers side surfaces and a bottom surface of the gap-fill layer, wherein the second barrier insulating layer covers an external side surface and a bottom surface of the first barrier insulating layer, and wherein the second barrier insulating layer in the plurality of protrusions is in contact with the sacrificial insulating layers.

* * * * *